US008283236B2

(12) United States Patent
Goodner et al.

(10) Patent No.: US 8,283,236 B2

(45) Date of Patent: Oct. 9, 2012

(54) METHODS OF FORMING CAPACITORS

(75) Inventors: Duane M. Goodner, Boise, ID (US); Sanjeev Sapra, Boise, ID (US); Darwin Franseda Fan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/010,156

(22) Filed: Jan. 20, 2011

(65) Prior Publication Data

US 2012/0187533 A1 Jul. 26, 2012

(51) Int. Cl.
*H01L 21/20* (2006.01)

(52) U.S. Cl. ................. 438/396; 438/398; 257/E21.648

(58) Field of Classification Search .................. 438/396, 438/398; 257/E21.648
See application file for complete search history.

(56) References Cited

U.S. PATENT DOCUMENTS 5,512,767 A * 4/1996 Noble, Jr. ...................... 257/301
5,793,077 A 8/1998 Tseng
5,926,719 A * 7/1999 Sung ............................. 438/396
6,271,079 B1 8/2001 Wei et al.
7,125,781 B2 10/2006 Manning et al.
7,387,939 B2 6/2008 Manning
7,655,969 B2 2/2010 Takaishi
7,713,813 B2 5/2010 Raghu
7,795,149 B2 9/2010 Sandhu
2004/0150030 A1 * 8/2004 Nishimura et al. ........... 257/309
2008/0157279 A1 7/2008 Horikawa

* cited by examiner

*Primary Examiner* — Alexander Ghyka
*Assistant Examiner* — Stanetta Isaac
(74) *Attorney, Agent, or Firm* — Wells St. John P.S.

(57) ABSTRACT

Some embodiments include capacitors. The capacitors may include container-shaped storage node structures that have, along a cross-section, a pair of upwardly-extending sidewalls. Individual sidewalls may have a narrower segment over a wider segment. Capacitor dielectric material and capacitor electrode material may be along the narrower and wider segments of the sidewalls. Some embodiments include methods of forming capacitors in which an initial container-shaped storage node structure is formed to have a pair of upwardly-extending sidewalls along a cross-section, with the sidewalls being of thickness that is substantially constant or increasing from a base to a top of the initial structure. The initial structure is then converted into a modified storage node structure by reducing thicknesses of upper segments of the sidewalls while leaving thicknesses of lower segments of the sidewalls substantially unchanged. Capacitor dielectric material and capacitor electrode material are formed along the modified storage node structure.

24 Claims, 20 Drawing Sheets

10 47 31 28 30 41 40 33 35 37 42 49 19 26 46 23a 23b 34 44 45 22 24 25 16 18 20 32 12

METHODS OF FORMING CAPACITORS

TECHNICAL FIELD

Capacitors and methods of forming capacitors.

BACKGROUND

Capacitors continue to have increasing aspect ratios in higher generation integrated circuitry fabrication. For example, dynamic random access memory (DRAM) capacitors now have elevations of from 1 to 3 microns, and widths of less than or equal to about 0.1 micron.

A common type of capacitor is a so-called container device. A storage electrode of such device is shaped as a container. Dielectric material and another capacitor electrode may be formed within the container and/or along an outer edge of the container, which can form a capacitor having high capacitance and a small footprint.

Container-shaped storage nodes are becoming increasingly taller and narrower (i.e., are being formed to higher aspect ratios) in an effort to achieve desired levels of capacitance while decreasing the amount of semiconductor real estate consumed by individual capacitors. Unfortunately, high aspect ratio container-shaped storage nodes can be structurally weak, and subject to toppling, twisting and/or breaking from an underlying base.

Exemplary methodology being developed to avoiding toppling of high aspect ratio containers is so-called lattice methodology, as described in, for example, U.S. Pat. Nos. 7,713,813, 7,125,781 and 7,387,939. In such methodology, a lattice is provided to hold container-shaped electrodes from toppling, while leaving outer surfaces of the container-shaped electrodes exposed for utilization as capacitive surfaces of capacitors.

Unfortunately, lattice methodology alone is not enough to prevent toppling, twisting and breaking of container-shaped storage nodes formed to increasingly high aspect ratios. Accordingly, it is desired to develop new storage node structures, and new methods for forming storage node structures.

DETAILED DESCRIPTION OF THE ILLUSTRATED EMBODIMENTS

In some embodiments, the invention includes capacitor structures having container-shaped storage nodes. The individual storage nodes have a base, and have sidewalls extending upwardly from such base. The sidewalls are thinner at the upper regions of the storage nodes than at the bases of the storage nodes. The thinned upper regions of the sidewalls may enable benefits in cell capacitance to be achieved while the thick lower regions of the sidewalls may enable improved stability of the capacitors to be achieved. In some embodiments, the invention includes of forming container-shaped storage nodes with sidewalls that are thinner at the top than at the bottom.

Example embodiments are described with reference to FIGS. 1-20.

Figure 1:
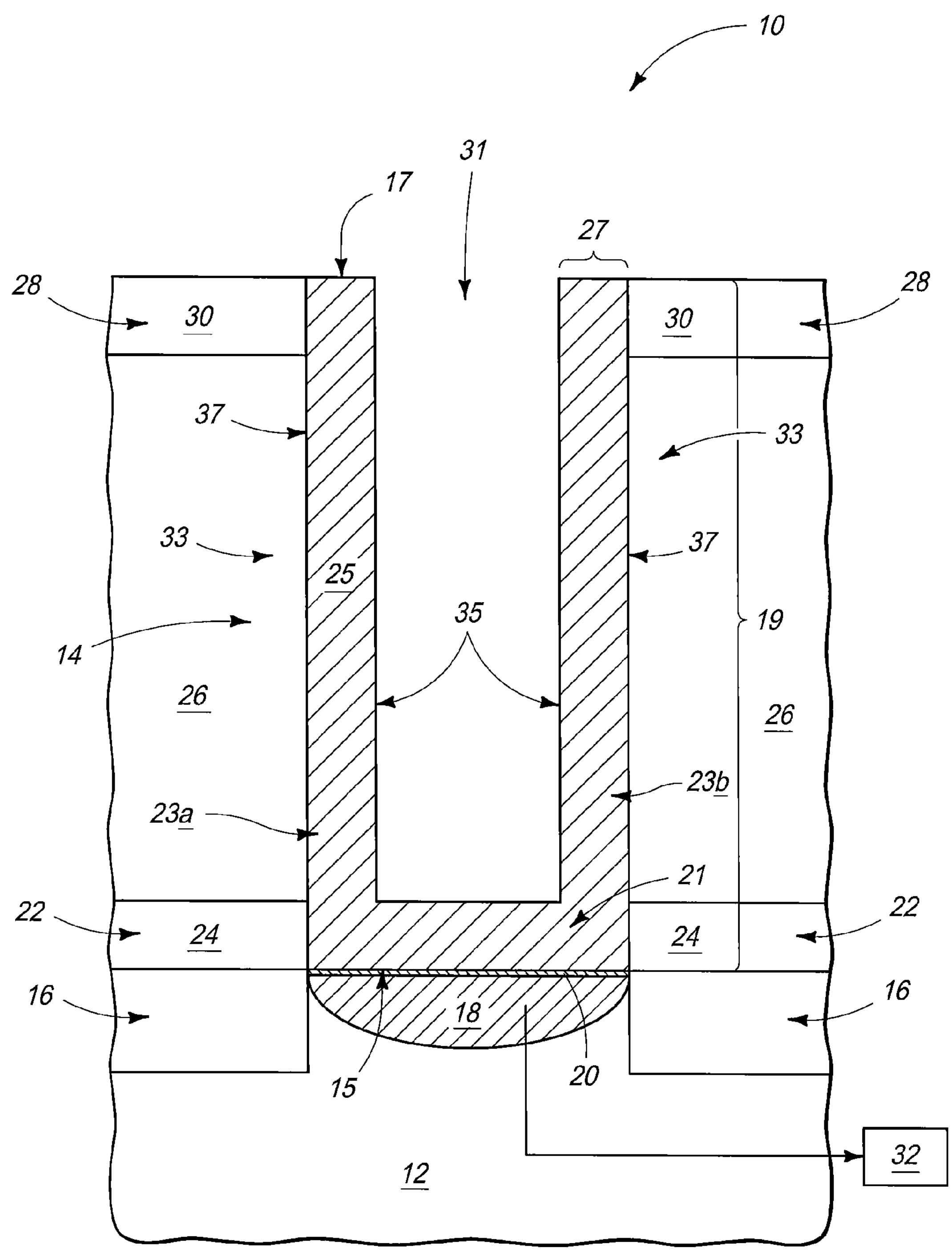
FIGS. 1 and 3-8 are diagrammatic, cross-sectional views of a portion of a semiconductor construction at processing stages of an example embodiment.
Figure 2:
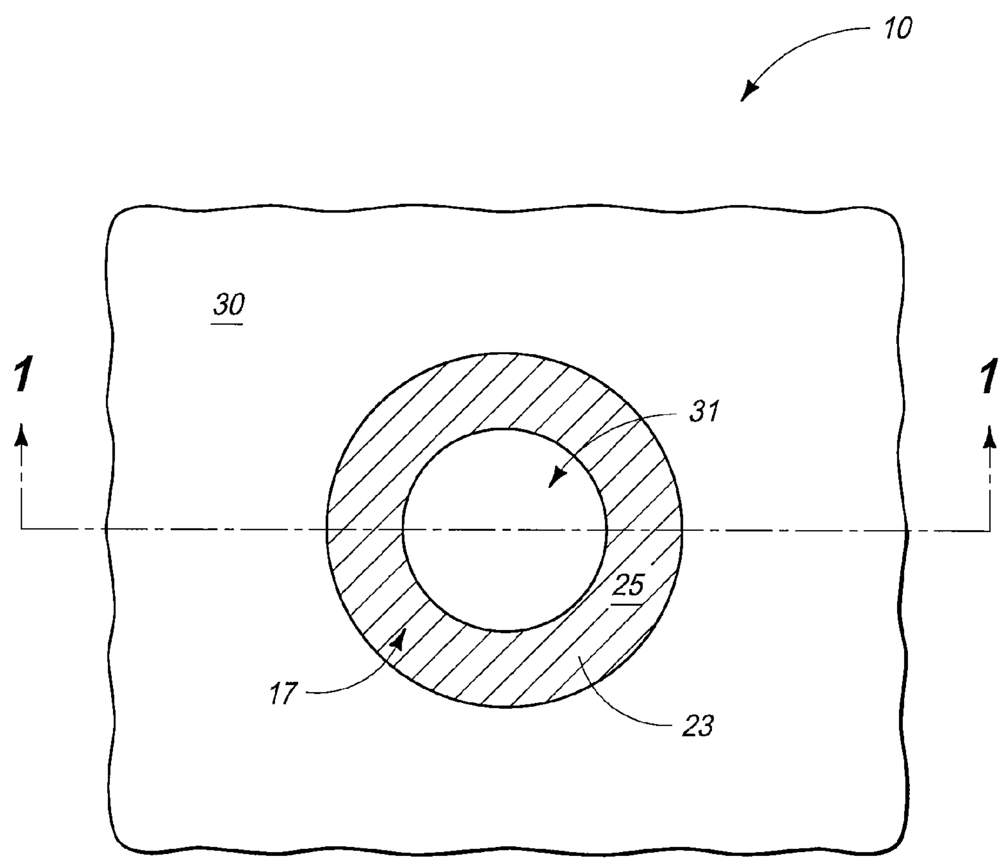
FIG. 2 is a diagrammatic top view of a portion of a semiconductor construction comprising the cross-section of FIG. 1 along the line 1-1.

Referring to FIGS. 1 and 2, a portion of a semiconductor construction 10 is shown in cross-sectional side view (FIG. 1) and top view (FIG. 2). The construction includes a container-shaped storage node structure 14 supported over a semiconductor substrate 12. The container-shaped storage node structure 14 may be referred to as an "initial" storage node structure to distinguish it from a modified storage node structure (shown in FIG. 5, for example) subsequently derived from the initial structure.

Substrate 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material regions (either alone or in assemblies comprising other materials). The term "substrate" refers to any supporting structure, including, but not limited to, the semiconductive substrates described above. Although substrate 12 is shown to be homogenous, the substrate may comprise numerous materials in some embodiments. For instance, substrate 12 may correspond to a semiconductor substrate containing one or more materials associated with integrated circuit fabrication. In such embodiments, such materials may correspond to one or more of refractory metal materials, barrier materials, diffusion materials, insulator materials, etc.

The container-shaped initial storage node structure 14 comprises a bottom 15, a top 17, and a height 19 from the bottom to top. In some embodiments the height 19 may be within a range of from about 10,000 Å to about 20,000 Å.

The initial storage node structure comprises a base 21 along the bottom, and comprises sidewalls **23*a* and 23*b* extending upwardly from such base. Although there appear to be two separate sidewalls along the cross-section of the view of FIG. 1, such sidewalls may be part of a single sidewall structure when considered in three dimensions. For instance, the top view of FIG. 2 shows that sidewalls 23*a* and 23*b* of FIG. 1 are actually part of a single circular cylinder 23 when viewed from above. The container-shaped initial storage node structure may have any suitable shape, and the top view of FIG. 2 illustrates one of numerous configurations. The storage node structure 14** may be, for example, circular, elliptical, polygonal, or any of numerous other configurations when viewed from above.

The storage node structure 14 is shown comprising a material 25. The material 25 may comprise any suitable composition or combination of compositions, and in some embodiments may comprise, consist essentially of, or consist of one or both of titanium and titanium nitride. For instance, in some example embodiments material 25 may be a single homogeneous composition (as shown), and may comprise, consist essentially of, or consist of titanium nitride. Alternatively, in some example embodiments material 25 may be heterogeneous and may comprise two discrete compositions, with one of the compositions being titanium nitride and another of the compositions being titanium. In other embodiments, material 25 may comprise one or more of any of numerous other suitable electrically conductive compositions.

The sidewalls 23*a* and 23*b* in the cross-sectional view of FIG. 1 have a substantially constant thickness 27 from the bottoms of the sidewalls to the tops of the sidewalls. The term "substantially constant thickness" means that the thickness is uniform to within tolerances imposed by the fabrication process utilized to form the initial storage node structure. In some embodiments, the thickness 27 of the sidewalls of the initial storage node structure may be within a range of from about 20 Å to about 100 Å, and may be, for example, about 70 Å. In some embodiments, the thickness may vary from the top of the sidewalls to the bottom of the sidewalls, with the top region of the sidewalls being thicker than the bottom region of the sidewalls due to difficulties associated with the uniform deposition of conductive material 25 within a high aspect ratio opening during formation of the initial storage node structure 14.

In the shown embodiment, the sidewalls 23*a* and 23*b* extend substantially perpendicular to a primary upper surface of substrate 12. In other embodiments, the sidewalls may be angled relative to such perpendicular orientation, depending on the particularities of the fabrication process utilized to form the initial storage node structure.

The container-shaped initial storage node structure has an interior region 31 and an exterior region 33. Interior surfaces 35 are along the interior region 31, and exterior surfaces 37 are along the exterior region 33.

Isolation regions 16 are shown extending into substrate 12, and a source/drain implant region 18 is shown to be between the isolation regions.

The isolation regions 16 may correspond to shallow trench isolation regions, and may be filled with any suitable electrically insulative composition or combination of electrically insulative compositions. For instance, in some embodiments the isolation regions 16 may be filled with one or more of silicon dioxide, silicon nitride and silicon oxynitride.

The source/drain implant region 18 may comprise any suitable dopant or combination of dopants, and in some embodiments may correspond to an n-type doped region of semiconductor material of substrate 12. For instance, substrate 12 may comprise monocrystalline silicon, and source/drain implant region 18 may correspond to a region of the substrate that is conductively doped with one or both of phosphorus and arsenic.

Source/drain implant region 18 is one example of an electrical node that may be electrically connected with a base of the initial storage node 14. Other electrical nodes may be utilized in other embodiments. Such other electrical nodes may comprise, for example, electrically conductive pedestals formed of one or more of various metals, metal-containing compositions, and conductively-doped semiconductor material.

In the shown embodiment, an electrically conductive material 20 is over implant region 18. Such conductive material may correspond to a metal/semiconductor material utilized to improve electrical coupling between the base of storage node 14 and the conductively-doped implant region 18. For instance, in embodiments in which substrate 12 comprises silicon, the material 20 may correspond to metal silicide (e.g., titanium silicide, tungsten silicide, etc.).

A contact isolation structure 22 is provided over substrate 12 and adjacent the base of the initial storage node structure 14. The contact isolation structure comprises a material 24. Material 24 may be of any suitable electrically insulative composition or combination of compositions; and in some embodiments may comprise, consist essentially of, or consist of silicon nitride.

A sacrificial material 26 is over the contact isolation structure 22 and along the exterior surfaces 37 of the initial storage node structure 14. The sacrificial material may comprise any suitable composition or combination of compositions; and in some embodiments may comprise, consist essentially of or consist of one or more of silicate glass (for instance, borophosphosilicate glass, phosphosilicate glass, fluorosilicate glass, etc.), spin-on-dielectric, and silicon dioxide formed from tetraethyl orthosilicate (TEOS).

A lattice 28 is over the sacrificial material 26. In some embodiments, the lattice 28 may be referred to as an upper lattice in order to indicate that the lattice is above sacrificial material 26. There may be other lattices (not shown) in addition to the upper lattice, analogous to structures described in, for example, U.S. Pat. No. 7,387,939. The upper lattice 28 comprises a material 30. Such material may be any suitable composition or combination of compositions; and in some embodiments may comprise, consist essentially of, or consist of silicon nitride.

The contact isolation structure material 24, sacrificial material 26 and lattice material 30 may all be electrically insulative materials, and in some embodiments may be considered to form an electrically insulative stack.

In the shown embodiment, source/drain implant region 18 is electrically connected to a circuit device 32. In some embodiments, the storage node structure 14 is ultimately incorporated into a capacitor, and such capacitor is ultimately connected to a transistor to form a DRAM unit cell. Thus, circuit device 32 may correspond to a transistor gate that gatedly couples source/drain implant region 18 to another source/drain implant region (not shown). The transistor gate may be part of an access line (i.e., a wordline), and the other source/drain region may be connected to a digit line. Accordingly, the storage node structure 14 may be uniquely addressed through the combination of the digit line and the access line. The shown storage node structure 14 may be one of a large plurality of storage node structures that are subjected to identical processing during fabrication of a DRAM array. The initial container-shaped storage node structure 14 of FIGS. 1 and 2 may be analogous to container-shaped storage node structures described in one or more of U.S. Pat. Nos. 7,713,813, 7,125,781 and 7,387,939, and may be formed with processing analogous to that described in any of such patents.

Figure 3:
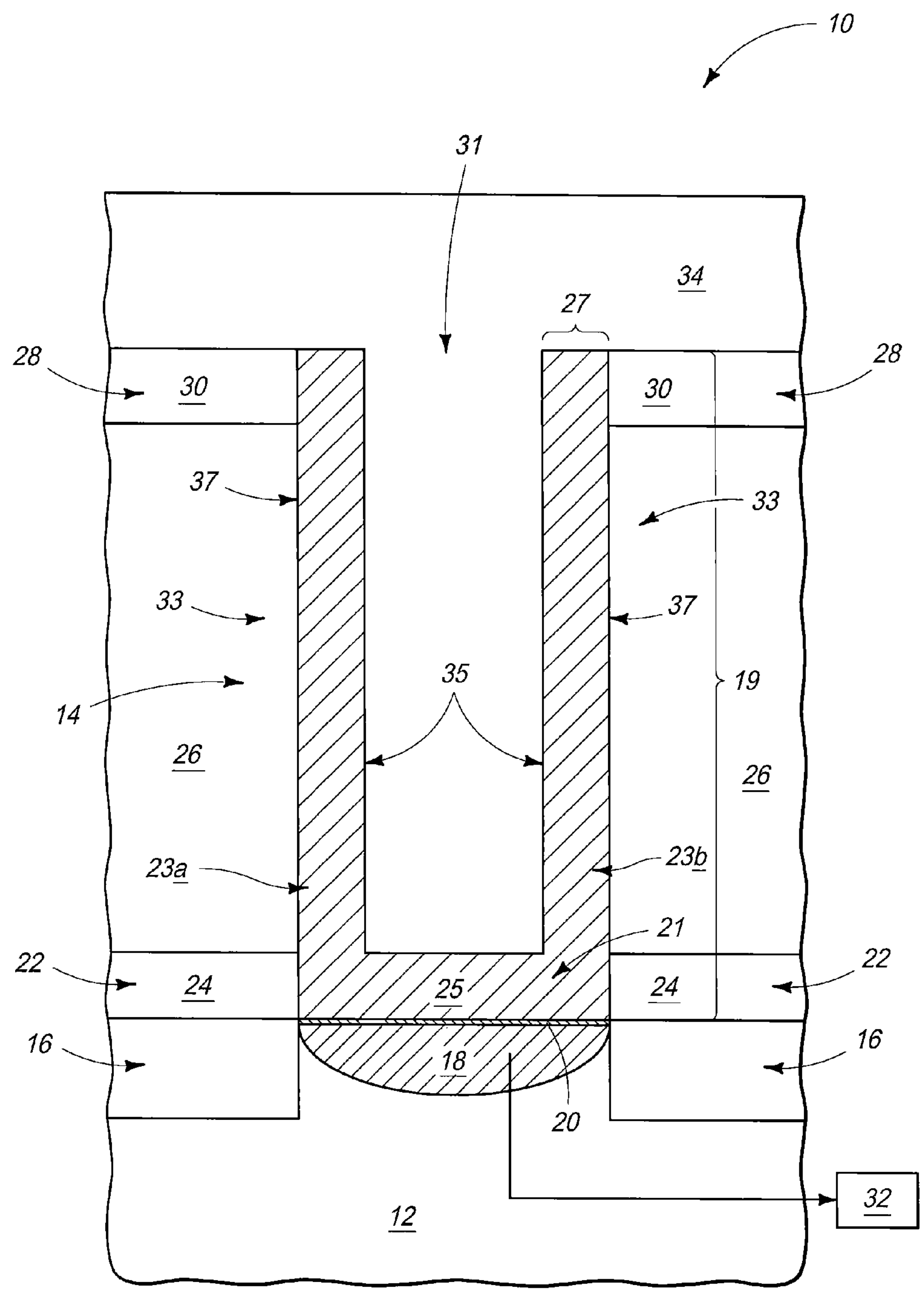

Referring to FIG. 3, a sacrificial material 34 is provided over lattice 30 and within the interior region 31 of the initial storage node structure 14. The sacrificial material 34 may comprise any suitable composition or combination of compositions; and in some embodiments may comprise, consist essentially of or consist of silicon (which may be, for example, in an amorphous phase and/or in a polycrystalline phase). The sacrificial materials 26 and 34 may be referred to as first and second sacrificial materials, respectively, to distinguish such sacrificial materials from one another.

Figure 4:
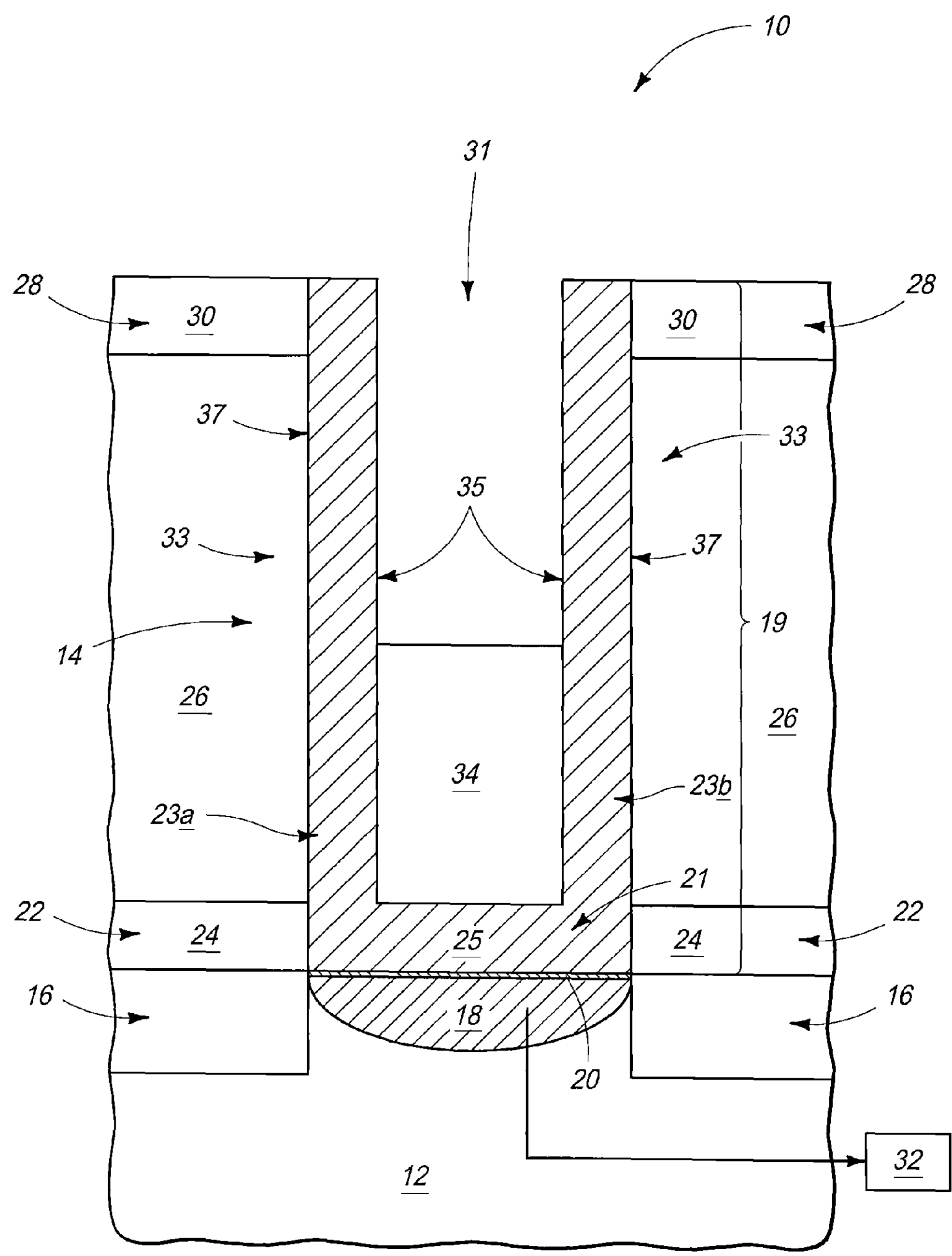

Referring to FIG. 4, sacrificial material 34 is subjected to an etch which removes a portion of the sacrificial material 34. Specifically, sacrificial material 34 is removed from over lattice material 30 and from within an upper portion of the interior region 31 of storage node structure 14, and some of the material 34 is left within a bottom portion of the interior region 31. The etch utilized to remove the portion of sacrificial material 34 may be a wet etch selective for the sacrificial material relative to the material 25 of storage node structure 14, and selective for the sacrificial material 34 relative to the lattice material 30. In embodiments in which sacrificial material 34 consists of silicon, the material 25 of the storage node structure consists of titanium nitride, and the lattice material 30 consists of silicon nitride, the etch may utilize brief exposure to hydrofluoric acid to remove native oxide from over the silicon-containing material 34, followed by utilization of one or more of the bases of ammonium hydroxide, tetramethylammonium hydroxide and potassium hydroxide to remove the portion of the silicon-containing material 34. For purposes of interpreting this document, an etch is considered to be "selective" for a first material relative to a second material if the etch removes the first material at a faster rate than the second material; which can include, but is not limited to, etches which are 100% selective for the first material relative to the second material.

The removal of the portion of the sacrificial material 34 exposes portions of the interior surfaces 35 of the sidewalls 23*a* and 23*b*.

In some embodiments, the material 34 may be first planarized with processing analogous to that described below with reference to FIG. 15, and then the remaining material 34 may be subjected to the etch to form the structure shown in FIG. 4.

Figure 5:
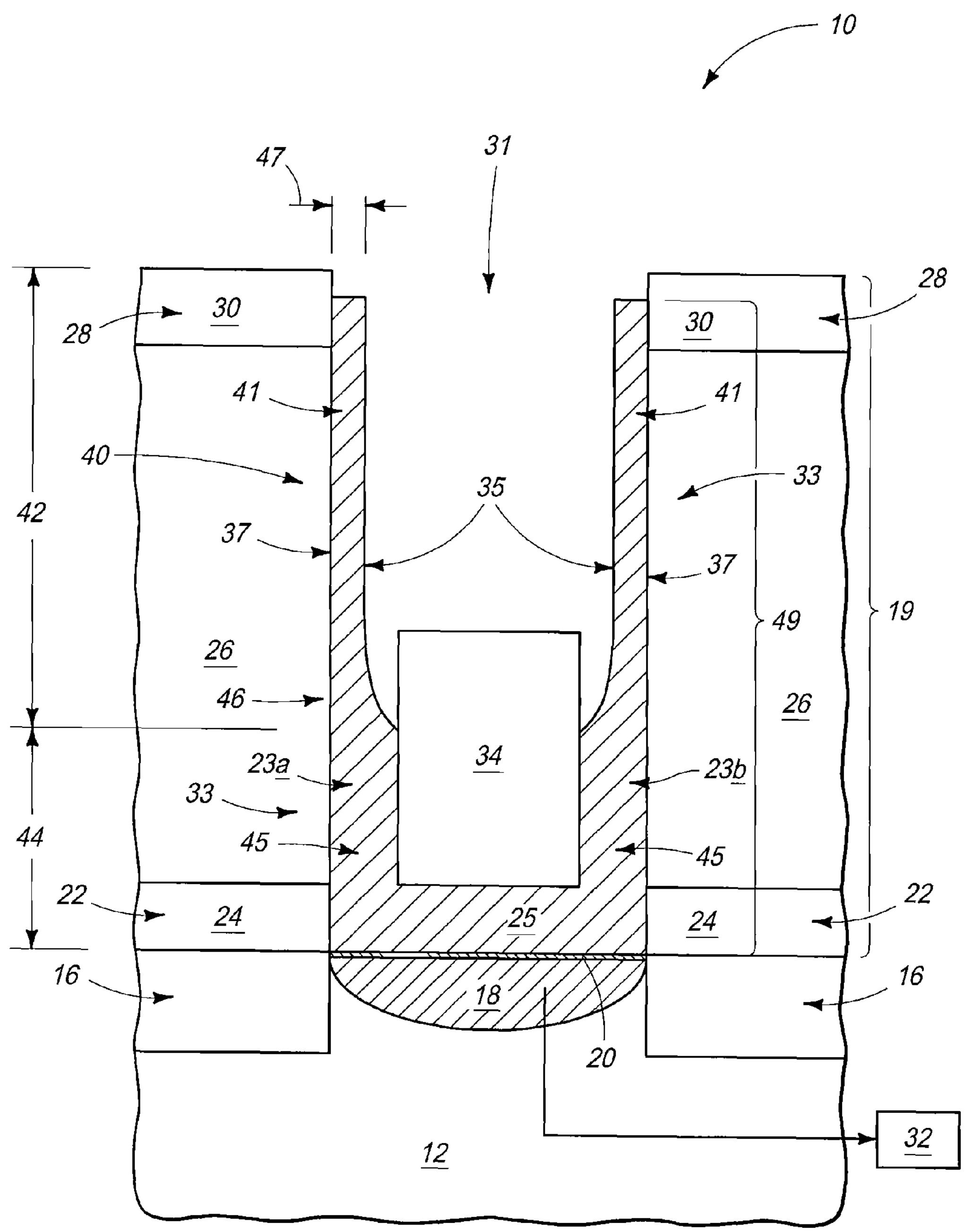

Referring to FIG. 5, etchant is utilized to reduce the thicknesses of exposed regions of the sidewalls 23*a* and 23*b* of the initial storage node structure 14 (FIG. 4). Such converts the initial storage node structure into a modified storage node structure 40 of FIG. 5. The etchant may comprise any suitable composition, and in embodiments in which the sidewalls comprise a material 25 consisting of titanium nitride, the etchant may comprise a combination of ammonium hydroxide and hydrogen peroxide. It may be desirable to utilize an etchant that removes the material 25 relatively slowly in order to have stringent control over the amount of material 25 removed during the etching process. Accordingly, it may be desirable to have the active components of the etchant be relatively dilute in the etchant and/or to utilize relatively cold etchant.

In the shown embodiment, the exterior surfaces 37 of the storage node structure are protected by sacrificial material 26 during the etching utilized to reduce the thickness of sidewalls 23*a* and 23*b*, and thus material 25 of the sidewalls is primarily removed from the interior surfaces 35.

The sacrificial material 34 protects lower segments of sidewalls 23*a* and 23*b* during etching of exposed regions of the sidewalls, and may be referred to as a protective material in some embodiments.

The removal of some of the storage node material 25 has reduced a thickness of uppermost segments (or regions) of the sidewalls while leaving the thicknesses of lower segments (or regions) of the sidewalls unchanged. The uppermost regions of sidewalls 23*a* and 23*b* remaining at the processing stage of FIG. 5 thus have a thickness 47 which is substantially reduced relative to the initial thickness 27 (FIG. 1) of the sidewalls. In some embodiments, the thickness 47 may be from about 20% to about 80% of the original thickness 27. In some embodiments, thickness 47 may be less than or equal to about one-half of the original thickness 27 of the sidewalls. For instance, the original thickness 27 may be about 70Å, and the thickness 47 may be less than or equal to about 35Å.

In the shown embodiment, the modified storage node structure 40 is shown having a height 49 that is reduced relative to the height 19 of the initial storage node structure. Such reduction in height is due to removal of some of the storage node material 25 from a top of the storage node structure during the reduction in the thicknesses of sidewalls 23*a* and 23*b*. The amount of material removed from the tops of the sidewalls will be about the same as the reduction in thicknesses of the sidewalls. This may be a very minor modification to the heights of the individual sidewalls. For instance, if the sidewalls are greater than or equal to about 15,000Å high, and the amount of material removed from the tops of the sidewalls is about 35Å, the height 49 will be greater than 99% of the initial height 19. In other words, the height 49 of the modified storage node structure 40 will be within about 1 percent of the initial height 19 (FIG. 4).

A scale is provided alongside structure 10 of FIG. 5 to diagrammatically illustrate that the modified container-shaped storage node structure 40 may be considered to be subdivided into an upper region 42 and a lower region 44, with the lower region having wider sidewall segments 45 and the upper region having narrower sidewall segments 41. The wider sidewall segments have the original thickness 27 (FIG. 1) of the sidewalls, and the narrower sidewall segments have thicknesses less than such original thickness. It is noted that the shown embodiment could be considered to have a transition region 46 in which the sidewall segments have intermediate thicknesses between the thicknesses of the narrowest sidewall segments and the wider sidewall segments 45. However, since the sidewall segments within the transition region 46 still have thicknesses less than the original thickness 27 (FIG. 1) of the sidewalls, the transition region may also be considered part of the shown upper region 42.

The relative dimensions of lower region 44 and upper region 42 may be determined, in part, by the height of sacrificial material 34 during the etch of storage node material 25, by the selectivity of the etch for material 25 relative to material 34, and/or by the duration of the etch. In some embodiments the lower region 44 will have a height that is less than or equal to about 30 percent of the height 19 of the initial storage node structure, or even less than or equal to about 20 percent of the height 19 of the initial storage node structure.

In some embodiments, the upper region 42 comprising the reduced thickness portions of the sidewalls will be at least about a top half of the height 49 of the modified storage node structure, at least about two-thirds of such height 49, or even at least about 80 percent of such height 49. For instance, in some embodiments the upper region 42 may be from about 20% to about 80% of the height 49.

The etch utilized to reduce the thickness of storage node material 25 has high selectivity for material 25 relative to protective material 34 in the shown embodiment, and may have 100% selectivity for material 25 relative to material 34 in some embodiments. In other embodiments, it can be advantageous to utilize an etch which is not 100 percent selective for storage node material 25 relative to the sacrificial material 34 (in other words, to utilize an etch which removes some of material 34 during the thinning of the sidewalls 23*a* and 23*b* of the storage node structure). The selectivity of the etch for the storage node material 25 relative to protective material 34 may be tailored in some embodiments, and may thus provide another controllable parameter for tailoring transition region 46 and the relative dimensions of upper region 42 and lower region 44 of the modified storage node structure 40.

Figure 6:
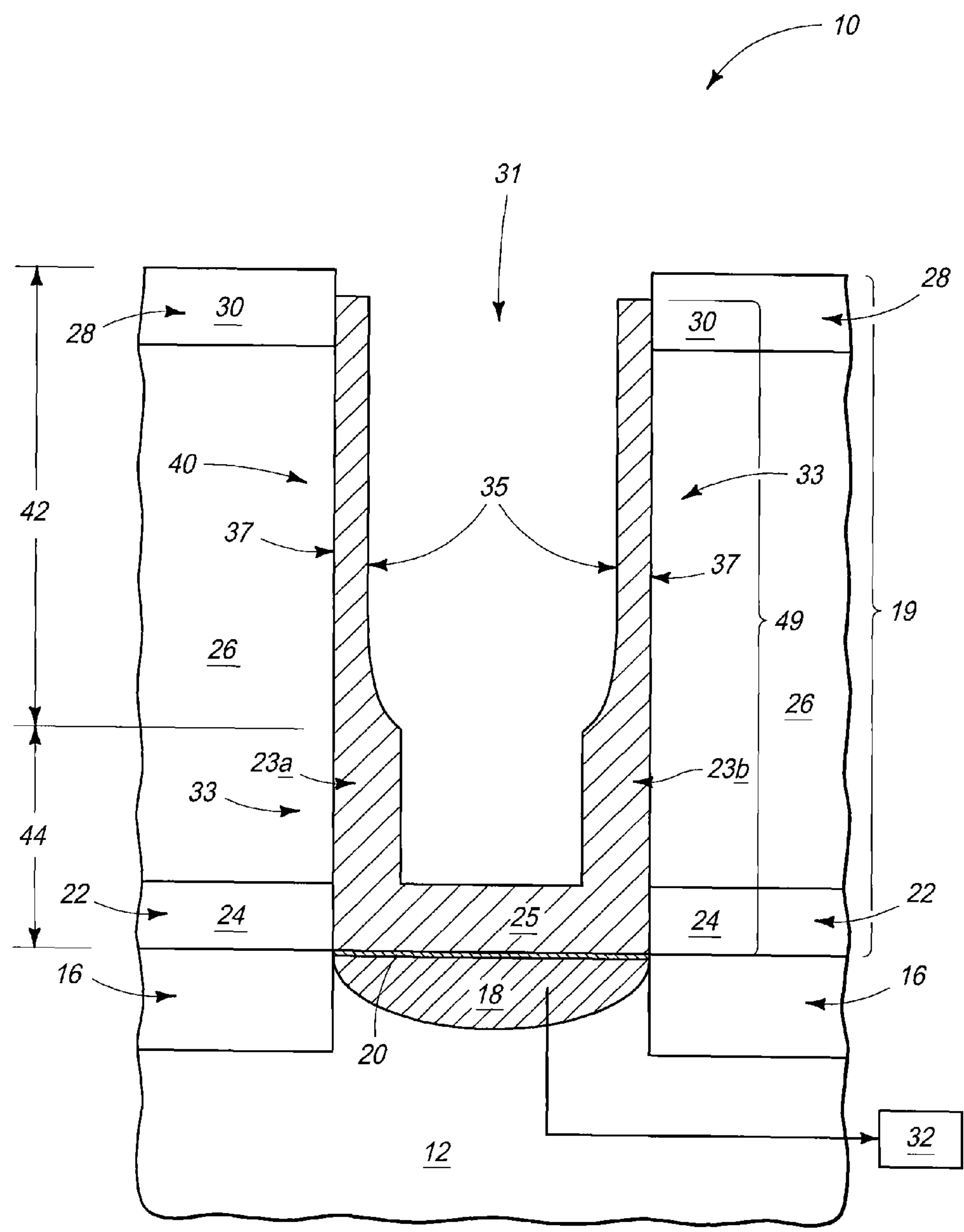

Referring to FIG. 6, sacrificial material 34 (FIG. 5) is selectively removed relative to storage node material 25. Such removal may utilize any suitable processing. In some embodiments, the removal may utilize a wet etch process identical to that described above with reference to FIG. 4 for removing the initial portion of sacrificial material 34. The etch utilized to remove sacrificial material 34 may be 100% selective for material 34 relative to material 25, in which case the thickness of material 25 in the lower region 44 remains unchanged relative to the initial thickness of material 25 (i.e., the thickness at the processing stage of FIG. 1). Alternatively, the etch utilized to remove sacrificial material 34 may be less than 100% selective for material 34 relative to material 25, in which case the thickness of material 25 in the lower region 44 may be reduced during the removal of material 34. In any event, the thickness of material 25 in the lower region 44 will remain substantially unchanged in comparison to the change in thickness of the material 25 occurring in the upper region 42 in transitioning from the initial storage node structure 14 of FIG. 1 to the modified storage node structure 40 shown in FIG. 6. The thickness of material 25 in the lower region 44 may be considered to be "substantially unchanged" if less than 5% of the initial thickness of material 25 is removed, if the thickness of material 25 in the lower region 44 is at least about 20% greater than the thickness of material 25 in the upper region 42, and/or if any change in thickness in material 25 in the lower region is less than one-fifth of the change in thickness of the material 25 in the upper region 42.

Figure 7:
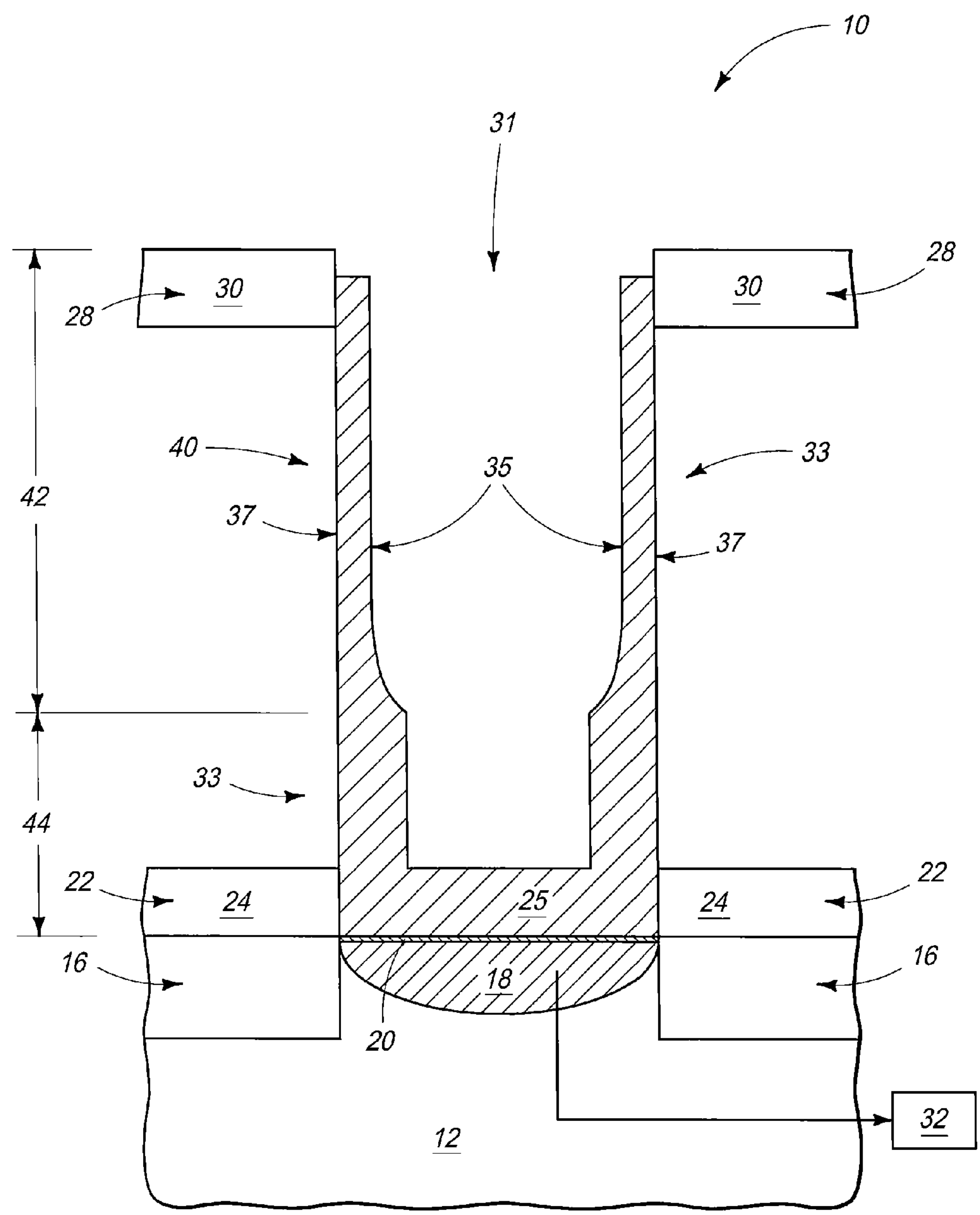

Referring to FIG. 7, sacrificial material 26 (FIG. 6) is selectively removed relative to storage node material 25, contact isolation material 24 and upper lattice material 30. Such removal may utilize one or more processes analogous to those described in U.S. Pat. Nos. 7,713,813, 7,125,781 and 7,387,939. The removal of sacrificial material 26 exposes regions of the exterior surfaces 37 of modified storage node structure 40. In some embodiments, a protective silicon coating (for instance, a coating of amorphous silicon and/or polycrystalline silicon) may be provided along interior surfaces of container-shaped structure 40 prior to removal of material 26. Such coating may protect interior surfaces of the container-shaped structure 40 during the etching utilized to remove material 26, and may protect a seam between storage node material 25 and lattice material 30 to avoid delamination. The protective coating may be removed after removal of material 26.

Figure 8:
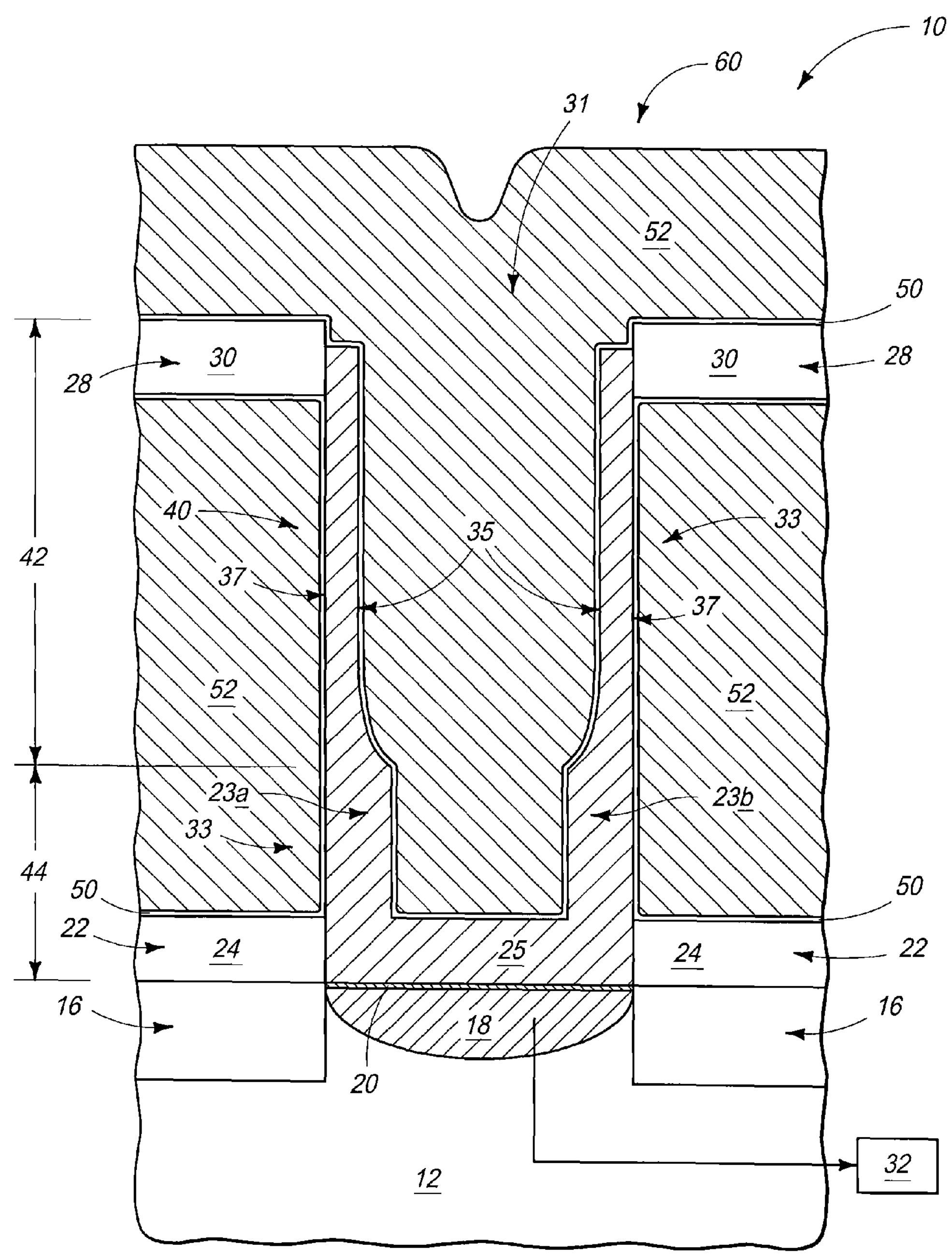

Referring to FIG. 8, capacitor dielectric material 50 is formed along the interior surfaces 35 and exterior surfaces 37 of modified storage node structure 40, and subsequently capacitor electrode material 52 (which may also be referred to as cell plate material) is formed along the capacitor dielectric material. The capacitor electrode material is capacitively connected to the modified storage node structure 40 through the capacitor dielectric material. In the shown embodiment, the capacitor dielectric material 50 along the exterior surfaces 37 of the modified storage node structure 40 is formed under the upper lattice material 30.

Capacitor dielectric material 50 may comprise any suitable composition or combination of compositions; and in some embodiments may comprise one or both of silicon nitride and silicon dioxide.

Capacitor electrode material 52 may comprise any suitable composition or combination of compositions; and in some embodiments may comprise one or more of various metals (for instance, titanium, tungsten, etc.), metal-containing compositions (for instance, metal nitride, metal silicide, etc.) and conductively-doped semiconductor materials (for instance, conductively-doped silicon, conductively-doped germanium, etc.).

The capacitor dielectric material and capacitor electrode material may be formed utilizing any suitable methods, including, for example, one or more of atomic layer deposition (ALD), chemical vapor deposition (CVD), and physical vapor deposition (PVD); and in some embodiments may be formed utilizing processing analogous to one or more processes described in U.S. Pat. Nos. 7,713,813, 7,125,781 and 7,387,939.

The embodiment of FIG. 8 shows modified storage node structure 40 incorporated into a capacitor 60 comprising such storage node in combination with capacitor dielectric material 50 and capacitor electrode material 52. The capacitor may be utilized in combination with a transistor (which may correspond to the circuitry 32) to form a DRAM unit cell, and such unit cell may be representative of a large number of unit cells simultaneously formed and incorporated into a DRAM array.

The modified storage node 40 of capacitor 60 may be considered to comprise sidewalls **23*a* and 23*b* that have wider segments within lower region 44, and that have narrower segments within upper region 42. The wider segments may be referred to as lower segments, and the narrower segments as upper segments. In the shown embodiment, the dielectric material 50 extending along the interior surfaces 35 extends along both the upper and lower segments of the sidewalls; and likewise the dielectric material 50 extending along the exterior surfaces 37** of the storage node structure also extends along both the upper and lower segments of the sidewalls.

Although the source/drain implant region 18 is shown electrically connected to a circuit device 32 at the processing stage of FIG. 1, in other embodiments such electrical connection may occur at other processing stages. For instance, in some embodiments the electrical connection of the source/drain implant region to the circuitry 32 may occur at a processing stage subsequent to that of FIG. 8.

The example processing described above with reference to FIGS. 4 and 5 exposed an upper surface of storage node material 25 to the etch utilized to reduce the thickness of the storage node material, which resulted in a minor reduction in height of the thinned sidewall material remaining after such etch. In other embodiments, the upper surface of the storage node material may be protected during such etch. FIGS. 9-12 illustrate one example embodiment in which the upper surface of the storage node material is protected during the etch, and FIGS. 13-20 illustrate another example embodiment in which the upper surface of the storage node material is protected during the etch.

Figure 9:
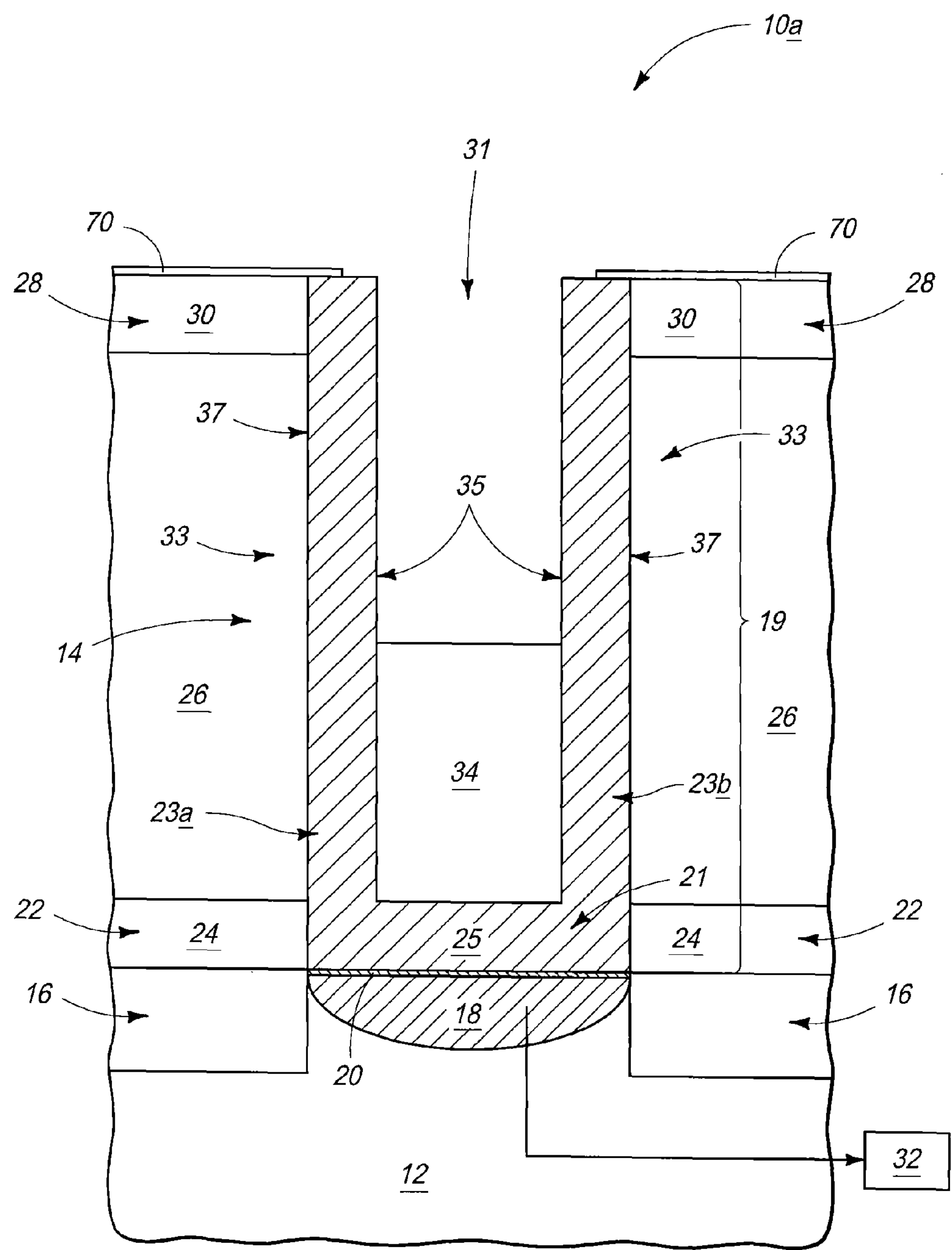
FIGS. 9-12 are diagrammatic, cross-sectional views of a portion of a semiconductor construction at processing stages of another example embodiment. The processing stage of FIG. 9 may follow that of FIG. 4.

FIG. 9 shows a construction **10*a* at a processing stage subsequent to that of FIG. 4, and in which protective material 70 is formed over upper lattice material 30 and partially across a top of the container-shaped initial storage node structure 14. The protective material 70 may comprise any suitable composition or combination of compositions, and in some embodiments may comprise, consist essentially of or consist of silicon. The protective material 70 may be formed after the reduction in height of sacrificial material 34, and such may be the case if protective material 70 comprises a common composition as material 34 (in order to avoid having material 70 removed during the etch of material 34). In other embodiments, protective material 70 may comprise a different composition than sacrificial material 34, and may be formed prior to the formation of sacrificial material 34 at the processing stage of FIG. 3**.

Figure 10:
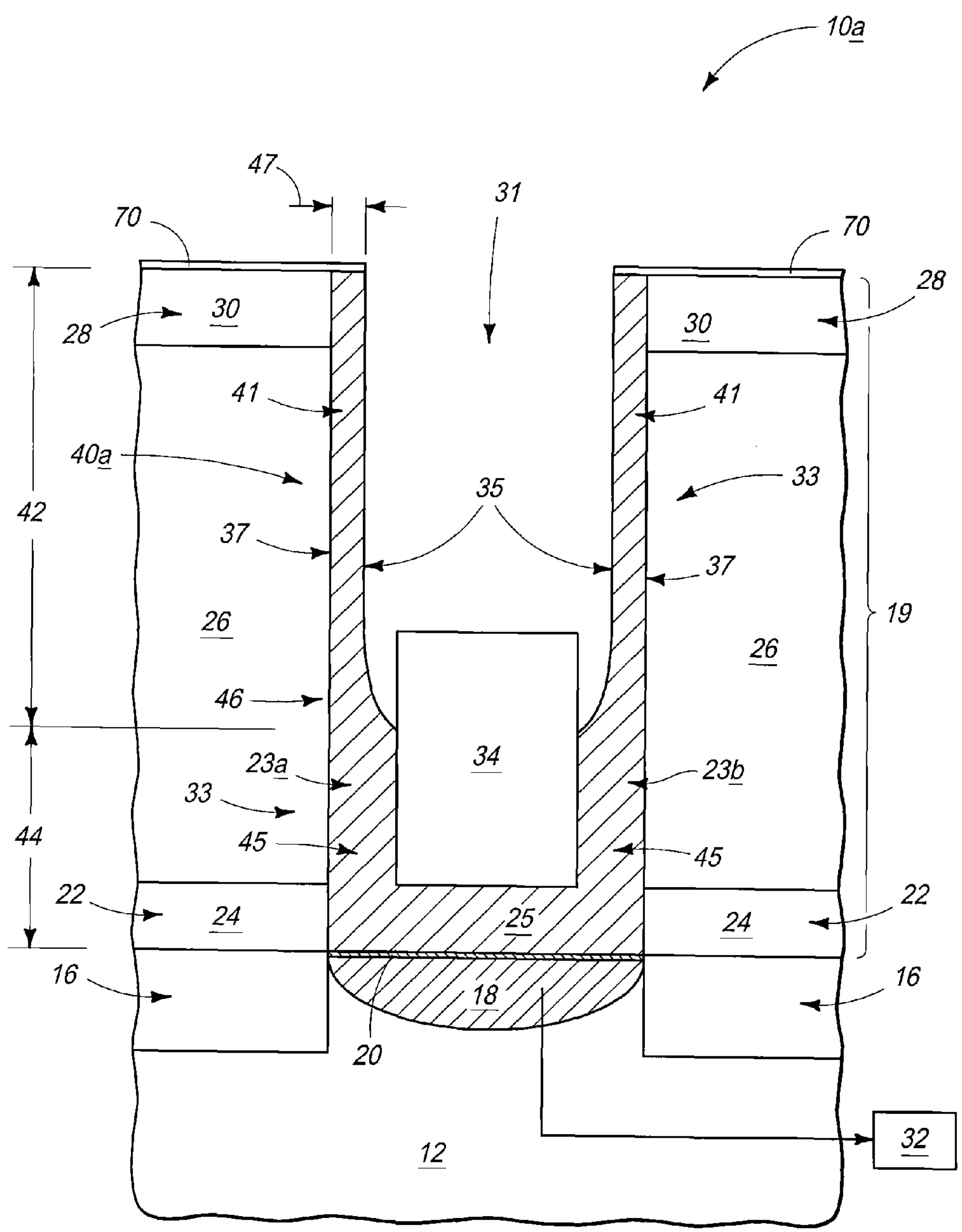

Referring to FIG. 10, construction **10*a* is subjected to processing analogous to that described above with reference to FIG. 5 to thin exposed regions of storage node material 25, and to thereby form a container-shaped modified storage node structure 40*a*. The modified storage node structure 40*a* is similar to modified storage node structure 40 of FIG. 5, except that the thinned sidewalls 23*a* and 23*b* of the structure 40*a* retain the full height 19**.

Figure 11:
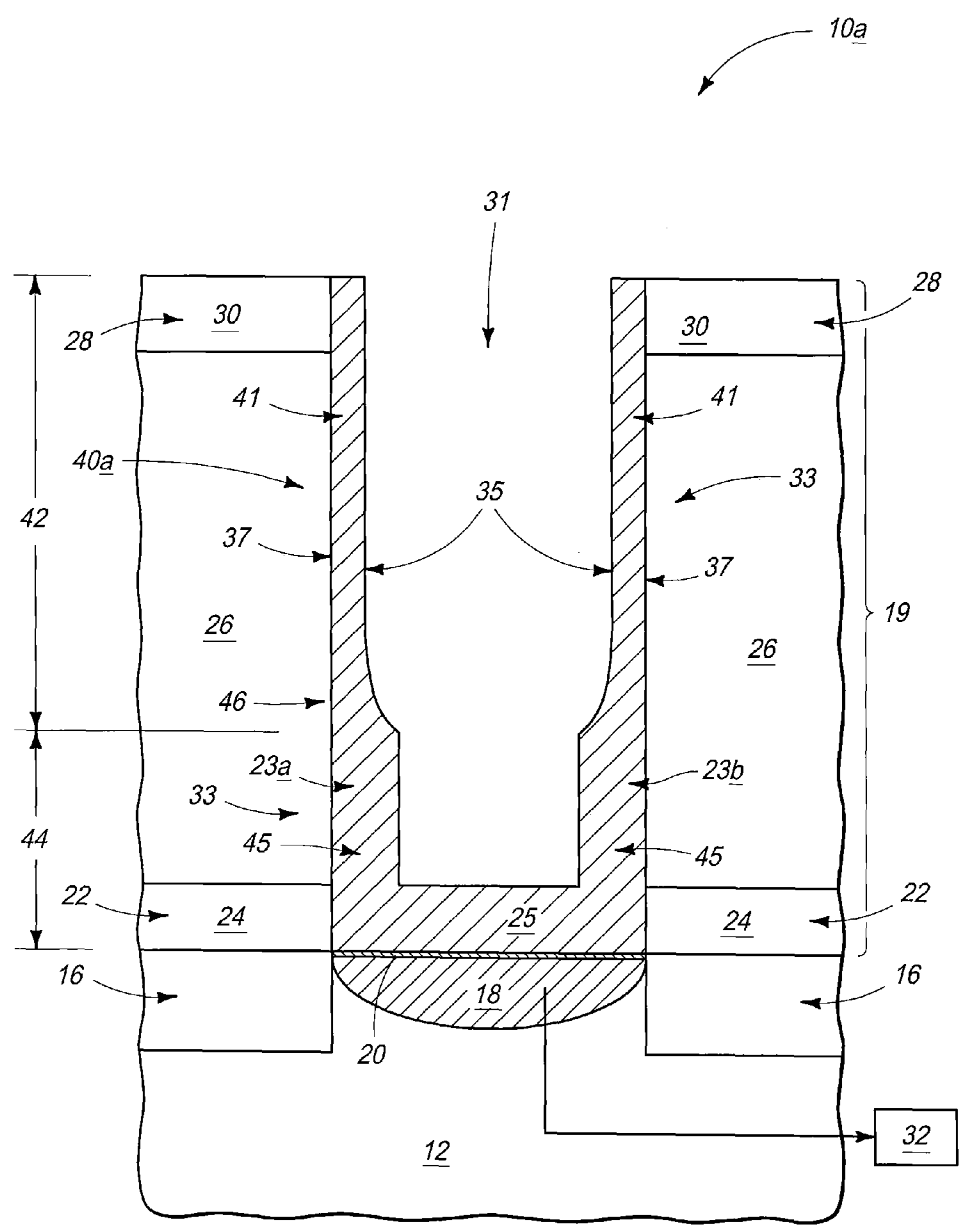

Referring to FIG. 11, protective material 70 (FIG. 10) and sacrificial material 34 (FIG. 10) are removed to form a structure analogous to that described above with reference to FIG. 6. However, the construction of FIG. 11 differs from that of FIG. 6 in that the sidewalls 23*a* and 23*b* of the modified storage node structure 40*a* of FIG. 11 retain the full height 19.

Figure 12:
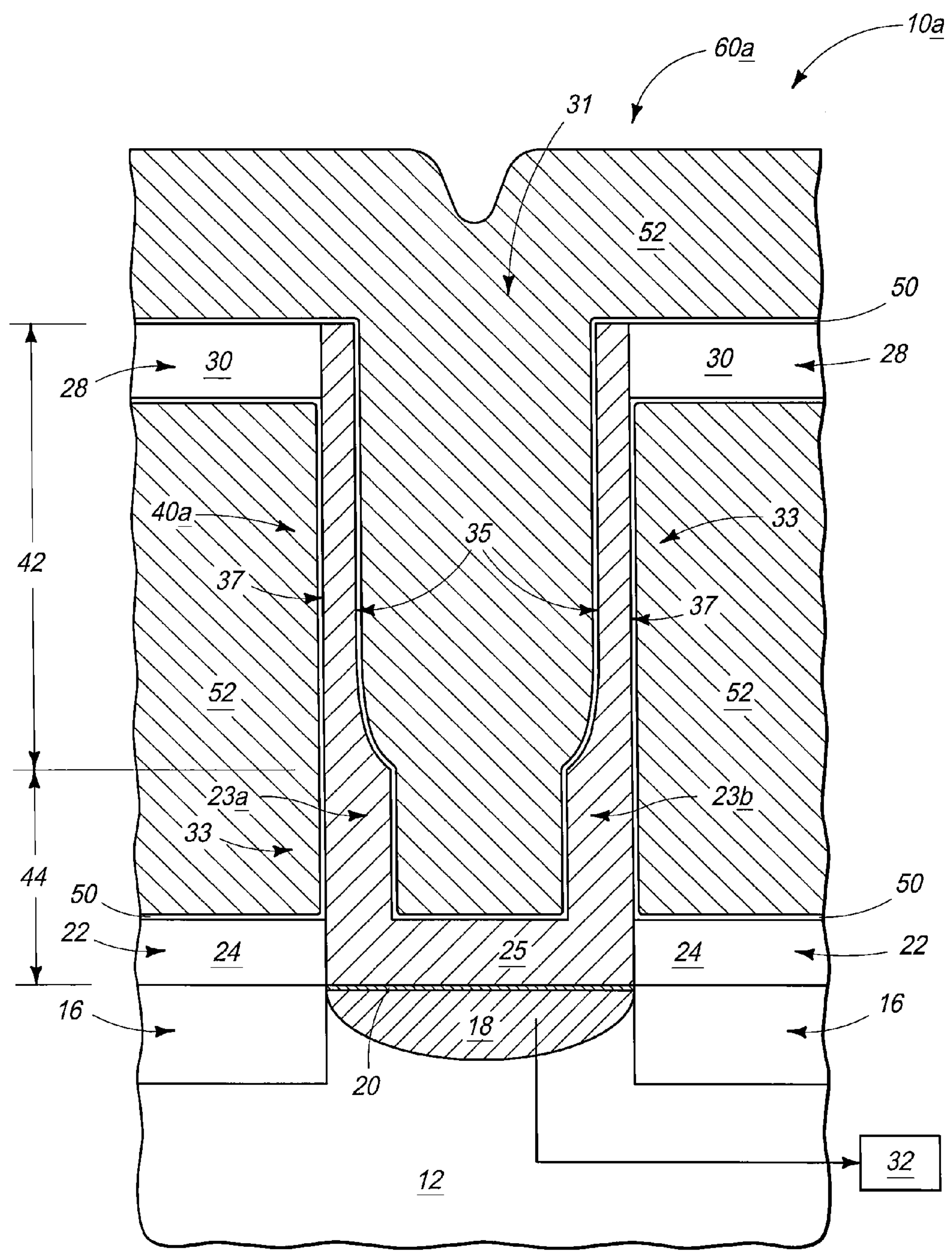

Referring to FIG. 12, material 26 (FIG. 11) is removed. Subsequently, capacitor dielectric material 50 and capacitor electrode material 52 are formed along the modified storage node structure 40*a* to incorporate such storage node structure into a capacitor construction 60*a* analogous to the capacitor construction 60 described above with reference to FIG. 8.

Another example embodiment method of forming a capacitor storage node is described with reference to FIGS. 13-20. Similar number will be used in describing FIGS. 13-20 as is used above to describe FIGS. 1-12, where appropriate.

Figure 13:
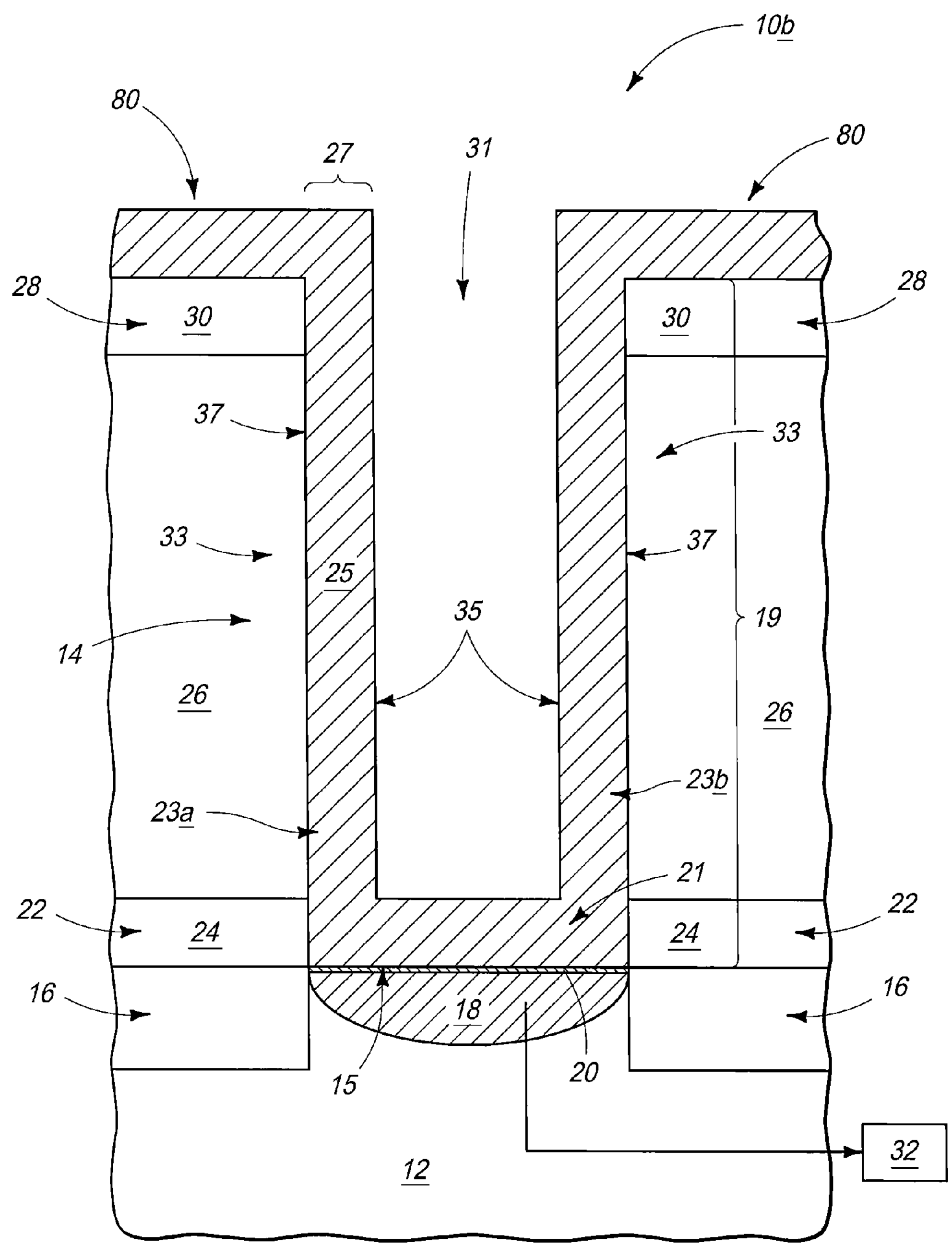
FIGS. 13-20 are diagrammatic, cross-sectional views of a portion of a semiconductor construction at processing stages of another example embodiment.

Referring to FIG. 13, a construction 10*b* is shown to comprise various materials and structures described above with reference to construction 10 of FIG. 1. The construction 10*b* comprises an initial storage node structure 14 analogous to that described above with reference to FIG. 1, with such structure comprising storage node material 25. A difference between the construction 10*b* of FIG. 13 and the construction 10 of FIG. 1 is that the construction of FIG. 13 comprises external regions 80 of material 25 that extend outwardly of opening 31, and across an upper surface of the lattice material 30. In some embodiments, the storage node structure 14 may be considered to be formed within an opening that extends through the insulative materials 24, 26, and 30; and the external regions 80 may be considered to extend across and directly against the uppermost insulative material 30.

Figure 14:
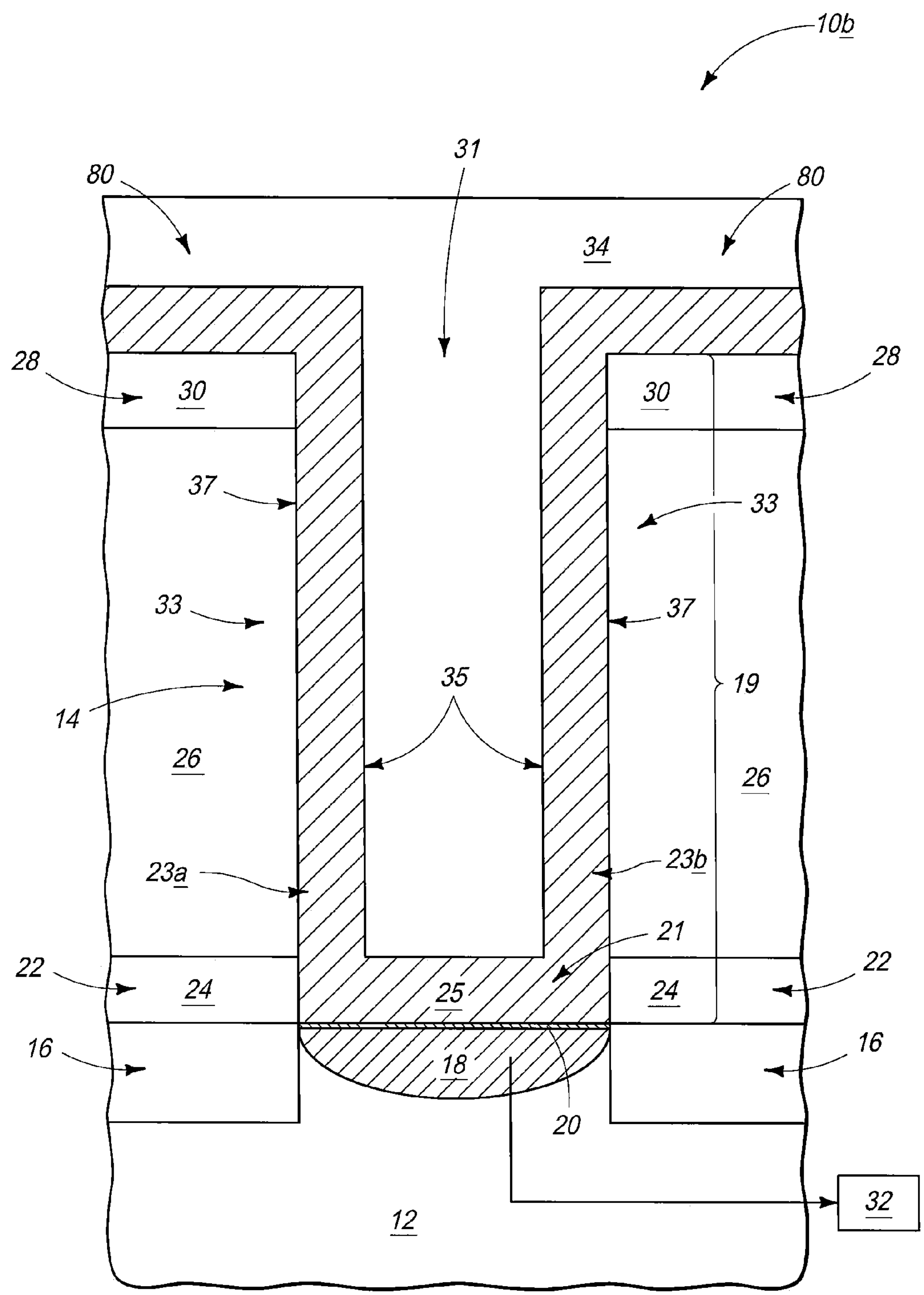

Referring to FIG. 14, sacrificial material 34 is provided over storage node material 25 and within the interior region 31 of the initial storage node structure 14. The material 34 may be considered to overfill the container of the container-shaped initial storage node structure.

Figure 15:
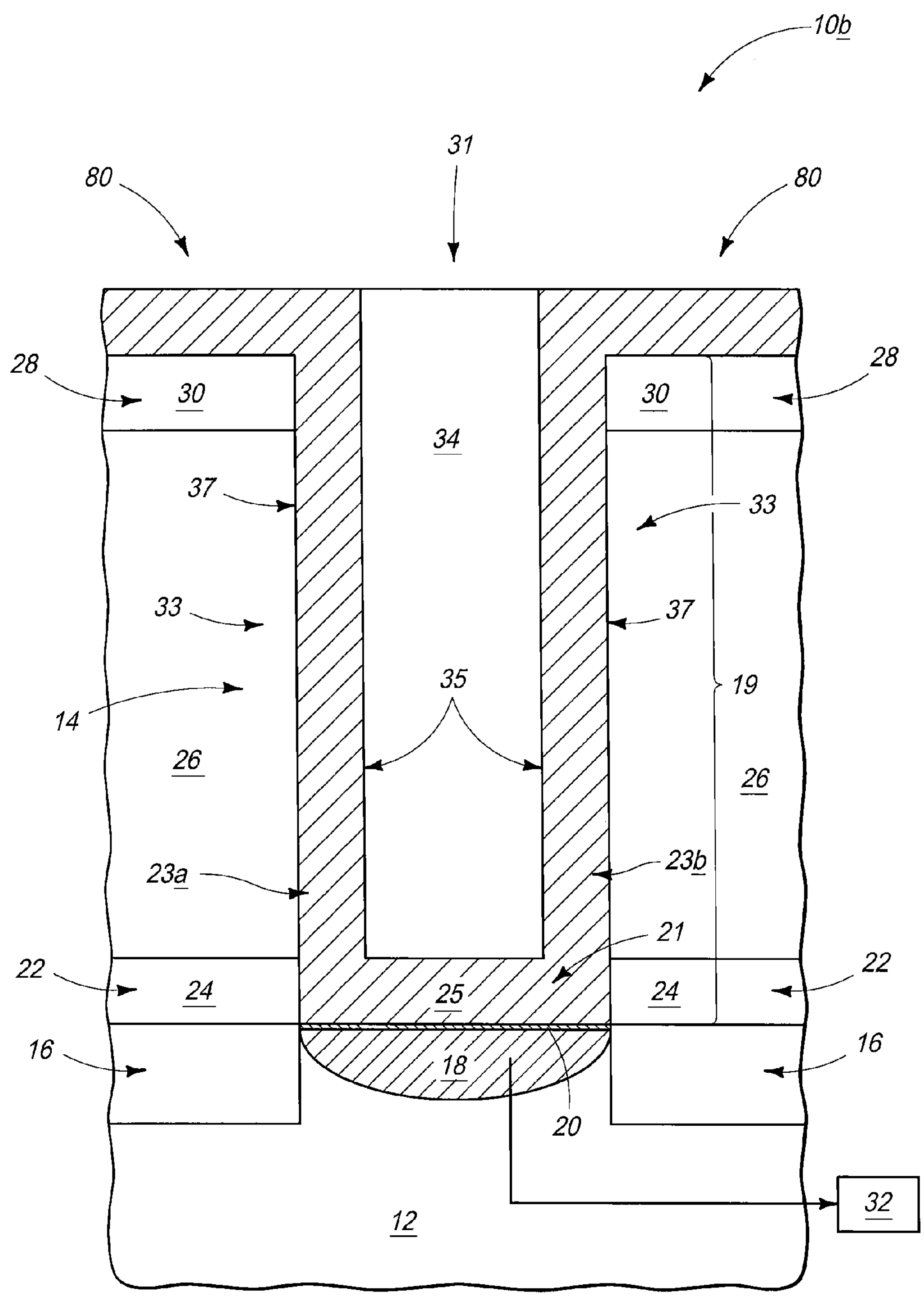

Referring to FIG. 15, material 34 is removed from over an upper surface of storage node material 25 with a planarization etch (such as, for example, chemical-mechanical polishing). The planarization etch removes excess material 34 from outside of the container-shaped storage node structure 14. Such removal may improve uniformity of a thickness of material 34 across construction 10*b* prior to removal of a portion of material 34 at a subsequent processing step (discussed below with reference to FIG. 16), which may improve container-to-container uniformity of the amount of material 34 remaining in containers after the processing step of FIG. 16. It is noted that the above-discussed processing of FIGS. 1-8 may have a similar planarization step utilized between the processing stages of FIGS. 3 and 4 in some embodiments. It is also noted that the planarization of FIG. 15 may be omitted in some embodiments if it is found that there is sufficient container-to-container uniformity achieved without such planarization.

Figure 16:
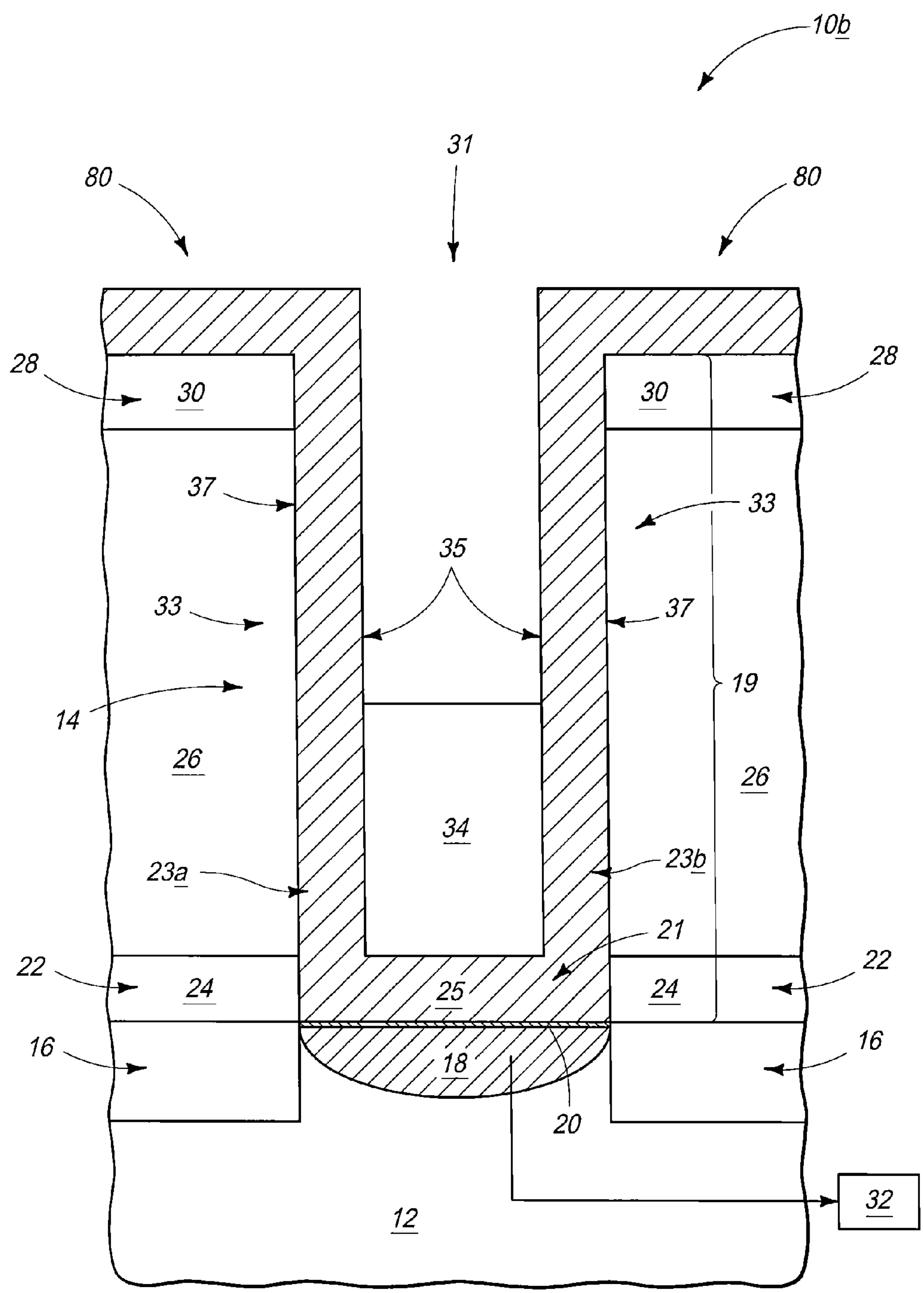

Referring to FIG. 16, sacrificial material 34 is subjected to an etch which removes a portion of the sacrificial material 34. Such etch may be conducted analogously to a similar etch discussed above with reference to FIG. 4.

Figure 17:
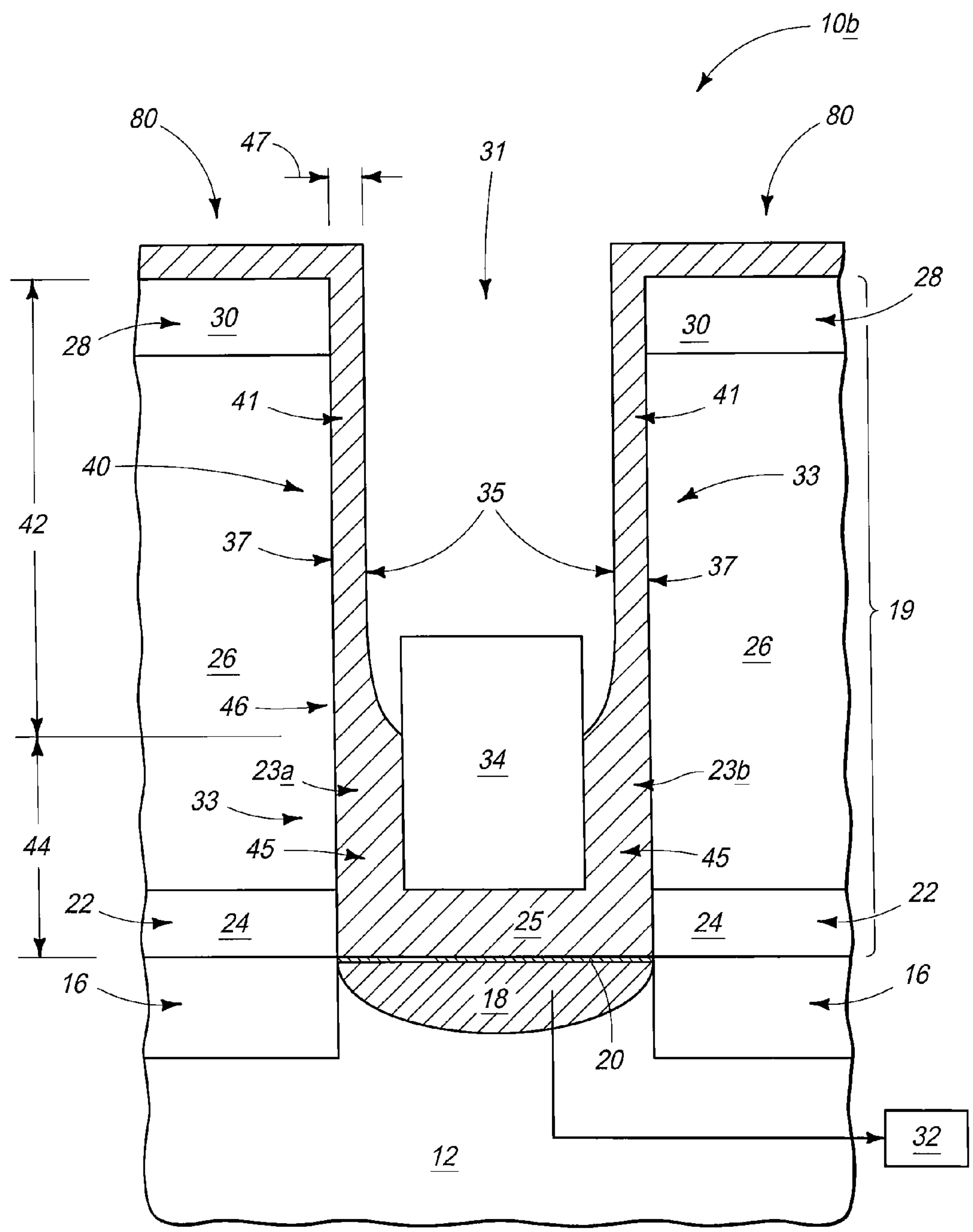

Referring to FIG. 17, etchant is utilized to reduce the thicknesses of exposed regions of the sidewalls 23*a* and 23*b* of the initial storage node structure 14 (FIG. 16). Such converts the initial storage node structure into a modified storage node structure 40 of FIG. 17. The etching utilized to reduce the thickness of exposed regions of the sidewalls 23*a* and 23*b* may be conducted analogously to similar etching discussed above with reference to FIG. 5. In the shown embodiment, the etching also reduces the thickness of material 25 within the external regions 80.

Figure 18:
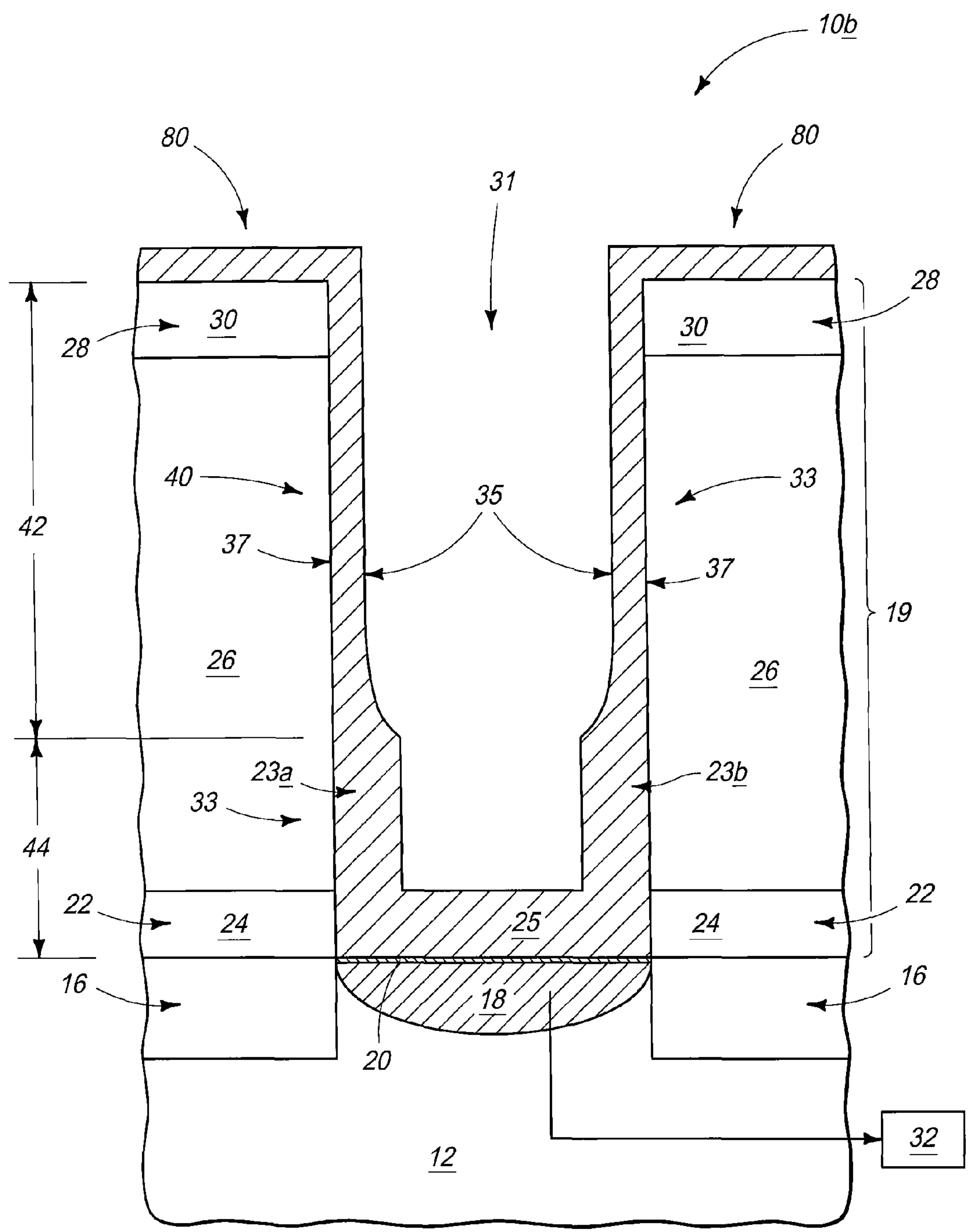

Referring to FIG. 18, sacrificial material 34 (FIG. 17) is selectively removed relative to storage node material 25. Such removal may utilize any suitable processing; including, for example, the example processing discussed above with reference to FIG. 6.

Figure 19:
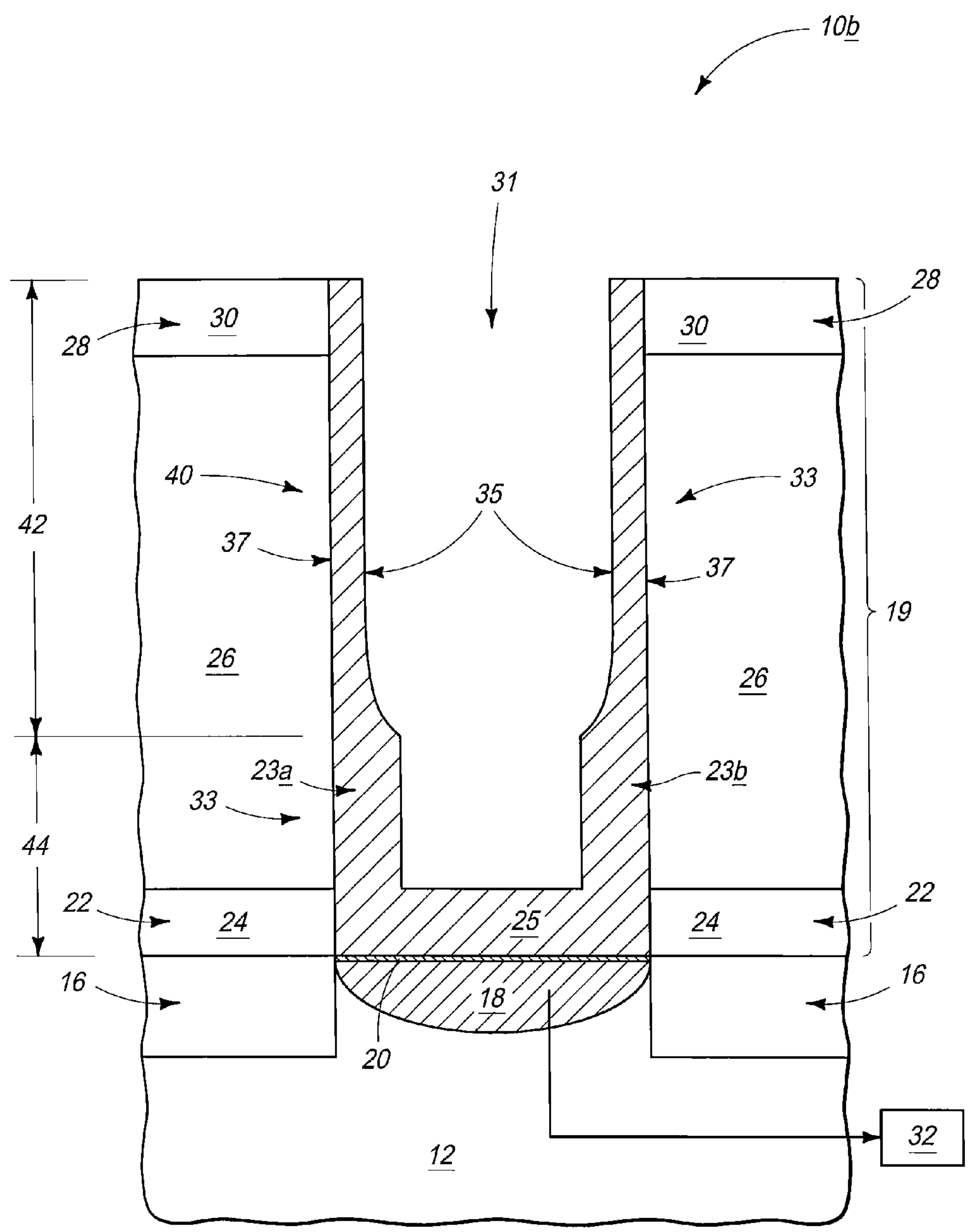

Referring to FIG. 19, the external regions 80 (FIG. 18) of storage node material 25 are removed from over the lattice 28. Such removal may utilize any suitable processing. For instance, protective material (not shown) may be formed within opening 31, planarization may be conducted to remove the material 25 from over lattice 28, and then the protective material may be removed to leave the construction of FIG. 19. If planarization is utilized to remove the material 25 from over lattice 28, the resulting storage node structure may have an uppermost top surface which is coplanar with an uppermost surface of the lattice material (as shown).

Figure 20:
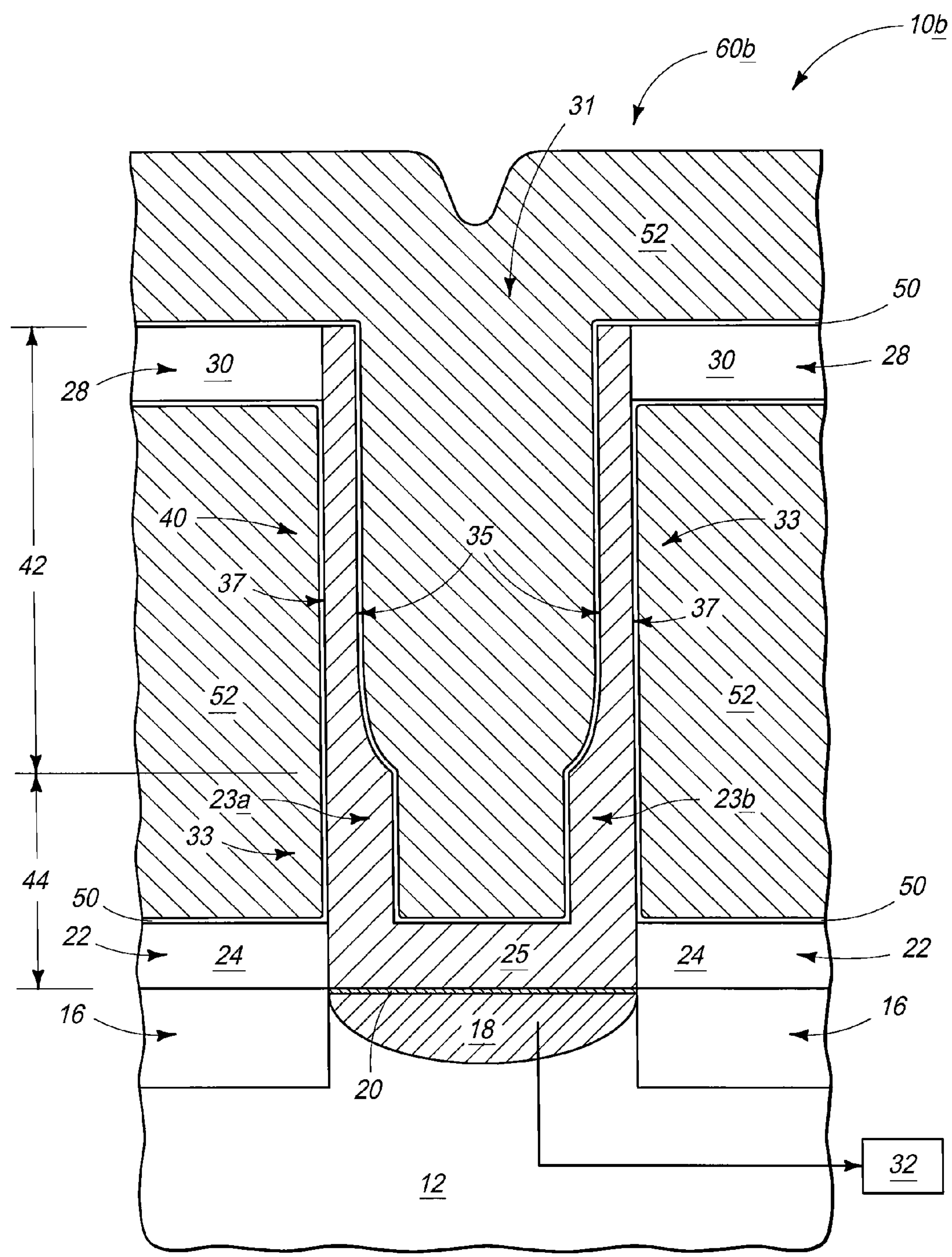

Referring to FIG. 20, material 26 (FIG. 19) is removed. Subsequently, capacitor dielectric material 50 and capacitor electrode material 52 are formed along the modified storage node structure 40 to incorporate such storage node structure into a capacitor construction 60*b* analogous to the capacitor construction 60 described above with reference to FIG. 8.

The embodiments of FIGS. 1-20 advantageously enable upper portions of a container-shaped capacitor storage node to be formed relatively thin, which can increase interior container area, and thereby increase cell capacitance within the container. Conventional methodology for increasing the container area is to uniformly decrease the thickness of the sidewalls of a container-shaped storage node. However, this decreases mechanical stability of the storage node, which can lead to breaking, bending, and/or electrical shorting between adjacent storage node containers. The problems associated with prior art processes may be exacerbated due to inherent problems associated the formation of container-shaped storage nodes in high aspect ratio openings. Specifically, it can be difficult to obtain uniform deposition of storage node material within high aspect ratio openings, which can lead to the bottom regions of the storage node structures having thinner sidewalls than the top regions of the storage node structures.

The embodiments described above with reference to FIGS. 1-20 can enable a bottom portion of a container-shaped storage of structure to have thick sidewall segments, while enabling the upper portion of the storage node structure to have desired thin sidewall segments. This can enable an increase in capacitance in the upper portion of the storage node, while maintaining mechanical stability at the lower portion of the storage node. A further advantage is that the thinned sidewall segments at the top of the storage node structures can decrease the overall mechanical load experienced at the lower portions of the storage node structures, which can further improve mechanical stability of the storage node structures.

Capacitors of the types discussed above with reference to FIGS. 1-20 may be incorporated into memory arrays, which in turn may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a capacitor, comprising:

forming an initial storage node structure over a semiconductor substrate; the initial storage node structure being container-shaped and having a bottom, a top, and a height from the bottom to the top; the initial storage node structure comprising a base at said bottom; the initial storage node structure comprising, along a cross-section, a pair of sidewalls extending upwardly from said base to said top;

converting the initial storage node structure into a modified storage node structure by reducing thicknesses of upper segments of the sidewalls while leaving thicknesses of lower segments of the sidewalls substantially unchanged; the modified storage node structure being container-shaped, having an upper region and a lower region, and having wider sidewall segments in the lower region and narrower sidewall segments in the upper region;

forming capacitor dielectric material along a surface of the modified storage node structure; and forming capacitor electrode material over the capacitor dielectric material, with the capacitor electrode material being capacitively coupled to the modified storage node structure through the capacitor dielectric material.

2. The method of claim 1 wherein the lower segments of the sidewalls of the modified storage node structure have thicknesses that are within about 5% of thicknesses of the lower segments of the sidewalls of the initial storage node structure.

3. The method of claim 1 wherein the lower segments of the sidewalls of the modified storage node structure have thicknesses that are at least about 20% greater than thicknesses of the upper segments of the sidewalls of the modified storage node structure.

4. The method of claim 1 wherein any change in thicknesses of the lower segments of the sidewalls of the modified storage node structure relative to thicknesses of the lower segments of the sidewalls of the initial storage node structure is less than about one-fifth of a change in thicknesses of the upper segments of the modified storage node structure relative to thicknesses of the upper segments of the sidewalls of the initial storage node structure.

5. The method of claim 1 wherein the height is within a range of from about 10,000 Å to about 20,000Å.

6. The method of claim 1 wherein the thicknesses of the upper segments of the sidewalls are reduced by about one-half.

7. The method of claim 1 wherein the sidewalls of the initial storage node structure have thicknesses of about 70 Å, and wherein the narrower sidewall segments of the modified storage node structure have thicknesses of less than or equal to about 35 Å.

8. The method of claim 1 wherein the lower region is less than or equal to about 30% of said height.

9. The method of claim 1 wherein the lower region is less than or equal to about 20% of said height.

10. The method of claim 1 wherein a height of the modified storage node structure is less than the height of the initial storage node structure.

11. The method of claim 1 wherein a height of the modified storage node structure is within about 1% of the height of the initial storage node structure.

12. The method of claim 1 further comprising forming a protective material partially across top surfaces of the sidewalls of the initial storage node structure to protect the sidewalls from being reduced in height during the conversion to the modified storage node structure.

13. The method of claim 1 wherein:

the initial storage node structure is within an opening that extends through one or more insulative materials, and comprises external regions that extend out of the opening and over an uppermost of the insulative materials;

the reducing the thicknesses of upper segments occurs while the external regions are over the uppermost of the insulative materials; and the external regions are removed prior to forming the capacitor dielectric material.

14. A method of forming a capacitor, comprising:

forming a container-shaped initial storage node structure over a semiconductor substrate; the initial storage node structure having a top, a bottom, and a height from the bottom to the top; the initial storage node structure comprising a base at said bottom; the initial storage node structure comprising, along a cross-section, a pair of sidewalls extending upwardly from said base to said top;

converting the initial storage node structure to a container-shaped modified storage node structure by reducing the thicknesses of the sidewalls along at least about a top half of the height while leaving the thicknesses of the sidewalls substantially unchanged within a region adjacent the base;

forming capacitor dielectric material along a surface of the modified storage node structure; and forming capacitor electrode material over the capacitor dielectric material, with the capacitor electrode material being capacitively coupled to the modified storage node structure through the capacitor dielectric material.

15. The method of claim 14 wherein:

the sidewalls of the container-shaped initial storage node structure comprise exterior surfaces along an outside of the container shape, and comprise interior surfaces along an interior of the container shape; and the exterior surfaces are blocked by one or more materials during the reducing of the thicknesses of the sidewalls so that sidewall material is primarily removed from the interior of the container shape during such reducing of the thicknesses of the sidewalls.

16. The method of claim 15 wherein:

said one or more materials include sacrificial material that is removed from along the exterior surfaces after the conversion to the modified storage node structure; and the dielectric material is formed after removal of the sacrificial material, and is formed along interior and exterior surfaces of the sidewalls of the container-shaped modified storage node structure.

17. The method of claim 15 wherein:

said one or more materials include sacrificial material that is removed from along the exterior surfaces after the conversion to the modified storage node structure, and include upper lattice material over the sacrificial material; and the dielectric material is formed after removal of the sacrificial material, and is formed along interior and exterior surfaces of the sidewalls of the container-shaped modified storage node structure, the dielectric material along the exterior surfaces of the sidewalls of the modified storage node structure being under the upper lattice material.

18. The method of claim 17 wherein the upper lattice material comprises silicon nitride, and wherein the sacrificial material comprises silicate glass.

19. The method of claim 14 wherein the reducing the thicknesses of the sidewalls comprises:

forming sacrificial material within a lower region of the initial storage node; and exposing upper segments of the sidewalls to an etch while using the sacrificial material to protect lower segments of the sidewalls within the lower region from being exposed to said etch.

20. The method of claim 19 wherein the forming the sacrificial material within the lower region comprises:

initially forming the sacrificial material to overfill the container-shaped initial storage node structure;

planarizing the sacrificial material to remove excess sacrificial material from outside of the container-shaped initial storage node structure; and reducing a height of the sacrificial material within the container-shaped initial storage node structure.

21. The method of claim 19 wherein the sacrificial material comprises silicon.

22. The method of claim 19 wherein some of the sacrificial material is removed during said etch.

23. The method of claim 14 wherein the thicknesses of the sidewalls are reduced along a top two-thirds of said height.

24. The method of claim 14 wherein the thicknesses of the sidewalls are reduced along a top 80% of said height.

* * * * *